United States Patent
Lyndaker et al.

(10) Patent No.: US 10,381,201 B2
(45) Date of Patent: Aug. 13, 2019

(54) CONTROL OF ETCH RATE USING MODELING, FEEDBACK AND IMPEDANCE MATCH

(71) Applicant: Lam Research Corporation, Fremont, CA (US)

(72) Inventors: Bradford J. Lyndaker, San Ramon, CA (US); John C. Valcore, Jr., Fremont, CA (US); Seyed Jafar Jafarian-Tehrani, Fremont, CA (US); Zhigang Chen, Campbell, CA (US); Alexei Marakhtanov, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/463,875

(22) Filed: Mar. 20, 2017

(65) Prior Publication Data

US 2017/0194130 A1 Jul. 6, 2017

Related U.S. Application Data

(63) Continuation of application No. 14/152,729, filed on Jan. 10, 2014, now Pat. No. 9,620,334, which is a
(Continued)

(51) Int. Cl.
*H01J 37/32* (2006.01)
*G05B 17/02* (2006.01)
(Continued)

(52) U.S. Cl.
CPC ........ *H01J 37/32926* (2013.01); *G05B 17/02* (2013.01); *H01J 37/32082* (2013.01); *H01J 37/3299* (2013.01); *H01J 37/32183* (2013.01); *H01J 37/32935* (2013.01); *H03H 7/40* (2013.01); *H05H 1/46* (2013.01); *H01J 2237/334* (2013.01)

(58) Field of Classification Search
CPC ........... H01J 37/32926; H01J 37/32183; H01J 37/3299; H01J 2237/334; G05B 17/02
See application file for complete search history.

(56) References Cited

U.S. PATENT DOCUMENTS 6,424,232 B1 * 7/2002 Mavretic ........... H01J 37/32082
  333/17.3
2003/0098127 A1 * 5/2003 Nakano ............. H01J 37/32082
  156/345.44
(Continued)

*Primary Examiner* — Mohammad K Islam
(74) *Attorney, Agent, or Firm* — Penilla IP, APC

(57) ABSTRACT

A method for achieving an etch rate is described. The method includes receiving a calculated variable associated with processing a work piece in a plasma chamber. The method further includes propagating the calculated variable through a model to generate a value of the calculated variable at an output of the model, identifying a calculated processing rate associated with the value, and identifying based on the calculated processing rate a pre-determined processing rate. The method also includes identifying a pre-determined variable to be achieved at the output based on the pre-determined processing rate and identifying a characteristics associated with a real and imaginary portions of the pre-determined variable. The method includes controlling variable circuit components to achieve the characteristics to further achieve the pre-determined variable.

18 Claims, 9 Drawing Sheets

Related U.S. Application Data continuation-in-part of application No. 14/043,525, filed on Oct. 1, 2013, now Pat. No. 9,337,000, and a continuation-in-part of application No. 14/043,574, filed on Oct. 1, 2013, now Pat. No. 9,401,264, and a continuation-in-part of application No. 13/717,538, filed on Dec. 17, 2012, now Pat. No. 9,320,126.

(51) Int. Cl.
  *H03H 7/40* (2006.01)
  *H05H 1/46* (2006.01)

(56) References Cited

U.S. PATENT DOCUMENTS

| | | | |
|---|---|---|---|
| 2007/0095788 A1* | 5/2007 | Hoffman | H01J 37/32174 216/59 |
| 2008/0179948 A1* | 7/2008 | Nagarkatti | H01J 37/32082 307/18 |
| 2011/0140607 A1* | 6/2011 | Moore | A61B 18/042 315/111.21 |
| 2011/0214811 A1* | 9/2011 | Ashida | C23C 16/50 156/345.28 |
| 2012/0000887 A1* | 1/2012 | Eto | H01J 37/321 216/61 |
| 2012/0043022 A1* | 2/2012 | Sharpless | H01J 37/321 156/345.37 |
| 2012/0074844 A1* | 3/2012 | York | H03H 7/40 315/111.21 |
| 2013/0002136 A1* | 1/2013 | Blackburn | H01J 37/32183 315/111.21 |
| 2013/0200257 A1* | 8/2013 | Chapon | H01J 49/105 250/282 |
| 2013/0277333 A1* | 10/2013 | Misra | C23F 1/08 216/61 |
| 2014/0173158 A1* | 6/2014 | Valcore, Jr. | G06F 13/40 710/305 |

* cited by examiner

US 10,381,201 B2

CONTROL OF ETCH RATE USING MODELING, FEEDBACK AND IMPEDANCE MATCH

CLAIM OF PRIORITY

This application is a continuation of and claims the benefit of and priority, under 35 U.S.C. § 120, to U.S. patent application Ser. No. 14/152,729, filed on Oct. 10, 2014, and titled "Control of Etch Rate Using Modeling, Feedback and Impedance Match", which is hereby incorporated by reference in its entirety.

The application Ser. No. 14/152,729 is a continuation-in-part of and claims the benefit of and priority, under 35 U.S.C. § 120, to U.S. patent application Ser. No. 14/043,525, filed on Oct. 1, 2013, and titled "Control of Impedance of RF Return Path", which is hereby incorporated by reference in its entirety.

The application Ser. No. 14/152,729 is a continuation-in-part of and claims the benefit of and priority, under 35 U.S.C. § 120, to U.S. patent application Ser. No. 14/043,574, filed on Oct. 1, 2013, and titled "Control of Impedance of RF Delivery Path", which is hereby incorporated by reference in its entirety.

The application Ser. No. 14/152,729 is a continuation-in-part of and claims the benefit of and priority, under 35 U.S.C. § 120, to U.S. patent application Ser. No. 13/717,538, filed on Dec. 17, 2012, and titled "Determining a Value of A Variable On an RF Transmission Model", which is hereby incorporated by reference in its entirety.

FIELD

The present embodiments relate to controlling etch rate using modeling, feedback, and an impedance matching circuit.

BACKGROUND

In some plasma processing systems, a radio frequency (RF) generator is used to generate an RF signal. The RF signal is supplied to a plasma chamber to generate plasma within the chamber.

The plasma is used for a wide variety of operations, e.g., cleaning a wafer, depositing oxides on the wafer, etching the oxides, etching the wafer, etc. To achieve a wafer yield, it is important to control uniformity of the plasma.

It is in this context that embodiments described in the present disclosure arise.

SUMMARY

Embodiments of the disclosure provide apparatus, methods and computer programs for controlling etch rate using modeling, feedback, and an impedance matching circuit. It should be appreciated that the present embodiments can be implemented in numerous ways, e.g., a process, an apparatus, a system, a device, or a method on a computer-readable medium. Several embodiments are described below.

In some embodiments, on-wafer uniformity control is achieved within an etch reactor, e.g., a 300 millimeter (mm) wafer etch reactor, a 200 mm wafer etch reactor, etc. Some factors that affect the etch uniformity include standing waves that are created by harmonic frequencies associated with a fundamental frequency of operation of an RF generator and that are created by intermodulation distortion (IMD) frequencies.

In various embodiments, a model of a portion of a plasma system is generated by a processor. A variable is determined at an output of the model. Based on the variable, a parameter, e.g., an etch rate, a deposition rate, gamma, etc., is determined. The calculated parameter is compared with a pre-determined parameter to determine whether there is a match between the calculated parameter and the pre-determined parameter. Upon determining that there is no match, a capacitance of a variable capacitor within an impedance matching circuit and/or an inductance of a variable inductor within the impedance matching circuit is changed to achieve the match. When the match is achieved, uniformity of plasma within a plasma chamber increases.

In several embodiments, a method for achieving an etch rate is described. The method includes receiving a calculated variable associated with processing a work piece in a plasma chamber. The plasma chamber is coupled to an impedance matching circuit via a radio frequency (RF) transmission line. The impedance matching circuit is coupled to an RF generator via an RF cable. The method further includes propagating the calculated variable through a computer-generated model to generate a value of the calculated variable at an output of the computer-generated model, identifying a calculated processing rate associated with the value of the calculated variable, and identifying based on the calculated processing rate a pre-determined processing rate to be achieved. The method also includes identifying a pre-determined variable to be achieved at the output of the computer-generated model based on the pre-determined processing rate and identifying a first characteristic associated with a real portion of the pre-determined variable. The first characteristic is of a first variable circuit component within the impedance matching circuit. The method includes controlling the first variable circuit component to achieve the first characteristic to further achieve the real portion of the pre-determined variable and identifying a second characteristic associated with an imaginary portion of the pre-determined variable. The second characteristic is of a second variable circuit component within the impedance matching circuit. The method includes sending a signal to the second variable circuit component to achieve the second characteristic to further achieve the imaginary portion of the pre-determined variable.

In some embodiments, a host controller is described. The host controller includes a memory device for storing a complex variable and a host processor coupled to the memory device. The host processor is used for receiving a calculated variable associated with processing a work piece in a plasma chamber, propagating the calculated variable through a computer-generated model to generate a value of the calculated variable at an output of the computer-generated model, and identifying a calculated processing rate associated with the value of the calculated variable. The host processor is further used for identifying based on the calculated processing rate a pre-determined processing rate to be achieved, identifying a pre-determined variable at the output of the computer-generated model based on the pre-determined processing rate, and identifying a first characteristic associated with a real portion of the pre-determined variable. The first characteristic is of a first variable circuit component within the impedance matching circuit. The host processor is used for sending a signal to the first variable circuit component to achieve the first characteristic to further achieve the real portion of the pre-determined variable and identifying a second characteristic associated with an imaginary portion of the pre-determined variable. The second characteristic is of a second variable circuit component within the impedance matching circuit. The method includes sending a signal to the second variable circuit component to achieve the second characteristic to further achieve the imaginary portion of the pre-determined variable.

In several embodiments, a non-transitory computer-readable storage medium with an executable program stored thereon is described. The program instructs a processor to perform the following operations. The operations include receiving a calculated variable associated with processing a work piece in a plasma chamber. The operations further include propagating the calculated variable through a computer-generated model to generate a value of the calculated variable at an output of the computer-generated model, identifying a calculated processing rate associated with the value of the calculated variable, and identifying based on the calculated processing rate a pre-determined processing rate to be achieved. The operations also include identifying a pre-determined variable to be achieved at the output of the computer-generated model based on the pre-determined processing rate and identifying a first characteristic associated with a real portion of the pre-determined variable. The first characteristic is of a first variable circuit component within the impedance matching circuit. The operations include sending a signal to the first variable circuit component to achieve the first characteristic to further achieve the real portion of the pre-determined variable and identifying a second characteristic associated with an imaginary portion of the pre-determined variable. The second characteristic is of a second variable circuit component within the impedance matching circuit. The operations include sending a signal to the second variable circuit component to achieve the second characteristic to further achieve the imaginary portion of the pre-determined variable.

Some advantages of the above-described embodiments include achieving a level of uniformity of plasma within a plasma chamber. The level of uniformity is achieved by controlling a circuit component that is already within an impedance matching circuit. As a result, there is none or minimal extra cost associated with achieving the uniformity. In some embodiments, uniformity is achieved by adding a circuit component within the plasma chamber. Cost and time consumed with adding the circuit component is not high. The circuit component is controlled to achieve the uniformity.

Other advantages of the above-described embodiments include controlling one circuit element of an impedance matching circuit to control a real portion of a variable and controlling another circuit element of the impedance matching circuit to control an imaginary portion of the variable. The separate control to control different portions of a variable helps achieve the uniformity. For example, a slight change in the uniformity is achieved by controlling the imaginary portion and a huge change in the uniformity is achieved by controlling the real portion.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for controlling etch rate using modeling, feedback, and an impedance matching circuit. It will be apparent that the present embodiments may be practiced without some or all of these specific details. In other instances, well known process operations have not been described in detail in order not to unnecessarily obscure the present embodiments.

Figure 1:
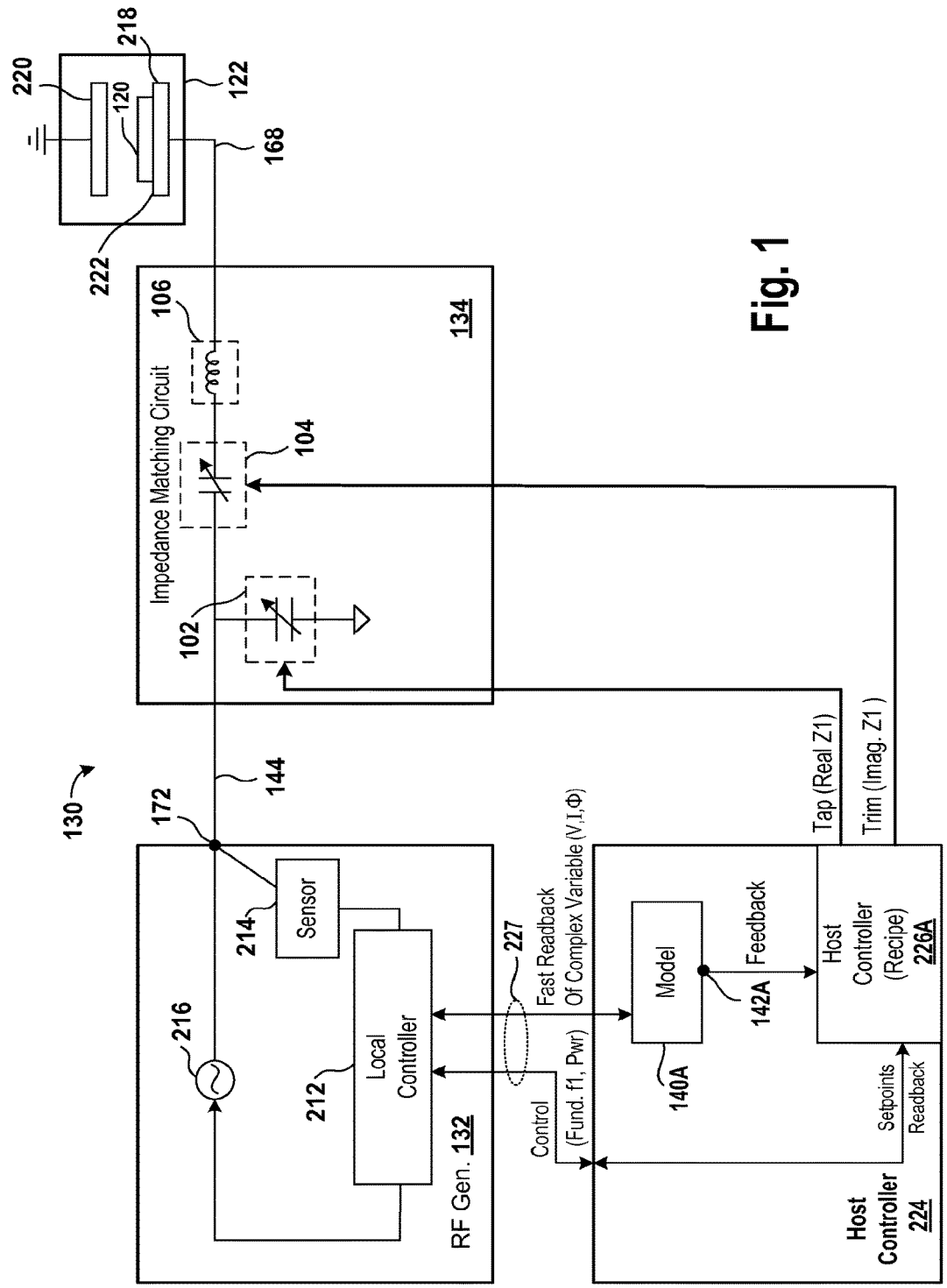
FIG. 1 is a block diagram of a system for controlling a rate using a computer-generated model and an impedance matching circuit, in accordance with an embodiment described in the present disclosure.

FIG. 1 is a block diagram of an embodiment of a system 130 for controlling a rate, e.g., an etch rate, a deposition rate, a change in gamma, etc., using a computer-generated model 140A and an impedance matching circuit 134. The system 130 includes an RF generator 132, a host controller 224, the impedance matching circuit 134, and a plasma chamber 122. Examples of the RF generator 132 include a 2 megahertz (MHz) RF generator, a 27 MHz RF generator, and a 60 MHz RF generator.

The RF generator 132 includes a local controller 212, a sensor 214, and a radio frequency (RF) power supply 216. In various embodiments, the sensor 214 is a voltage and current probe that is used to calibrate the RF generator 132 and that follows a National Institute of Standards and Technology (NIST) standard. For example, the sensor 214 used to calibrate the RF generator 132 is NIST traceable. The NIST standard provides a degree of accuracy specified by the NIST standard to the sensor 214. The sensor 214 is coupled to an output 172 of the RF generator 132.

In some embodiments, the sensor 214 is located outside the RF generator 132.

A controller, as used herein, a controller includes one or more processors, and one or more memory devices. Examples of a processor include a central processing unit (CPU), a microprocessor, an application specific integrated circuit (ASIC), and a programmable logic device (PLD), etc. Examples of a memory device include a read-only memory (ROM), a random access memory (RAM), or a combination thereof. Other examples of a memory device include a flash memory, a redundant array of storage disks (RAID), a non-transitory computer-readable medium, a hard disk, etc.

In some embodiments, the RF supply 216 includes a driver (not shown) and an amplifier (not shown). The driver, e.g., a signal generator, an RF signal generator, etc., is coupled to the amplifier, which is further coupled to the RF cable 144. The driver is connected to the local controller 212.

The RF generator 132 is coupled via an RF cable 144 to the impedance matching circuit 134. In several embodiments, the impedance matching circuit 134 is a circuit of one or more inductors and/or one or more capacitors. Each component, e.g., inductor, capacitor, etc., of the impedance matching circuit 134 is connected in series, or in parallel, or acts as a shunt, to another component of the impedance matching circuit 134.

The impedance matching circuit 134 is connected via an RF transmission line 168 to a chuck 218 of the plasma chamber 122. In various embodiments, the RF transmission line 168 includes a cylinder, e.g., a tunnel, etc., that is connected to an impedance matching network 134. Within a hollow of the cylinder lies an insulator and an RF rod. The RF transmission line 168 further includes an RF spoon, e.g., an RF strap, etc., that is coupled at one end to the RF rod of the cylinder. The RF spoon is coupled at another end to an RF rod of a vertically placed cylinder and the RF rod is coupled to the chuck 218 of the plasma chamber 122.

The plasma chamber 122 includes the chuck 218, an upper electrode 220, and other parts (not shown), e.g., an upper dielectric ring surrounding the upper electrode 220, an upper electrode extension surrounding the upper dielectric ring, a lower dielectric ring surrounding a lower electrode of the chuck 218, a lower electrode extension surrounding the lower dielectric ring, an upper plasma exclusion zone (PEZ) ring, a lower PEZ ring, etc. The upper electrode 220 is located opposite to and facing the chuck 218. A work piece 120 is supported on an upper surface 222 of the chuck 218. Examples of the work piece 120 include a substrate, a wafer, a substrate on which integrated circuits are formed, a substrate on which a layer of material is deposited, a substrate on which an oxide is deposited, etc. Each of the lower electrode and the upper electrode 220 is made of a metal, e.g., aluminum, alloy of aluminum, copper, etc. The chuck 218 may be an electrostatic chuck (ESC) or a magnetic chuck. The upper electrode 220 is coupled to a reference voltage, e.g., a ground voltage, a zero voltage, a negative voltage, etc.

A host controller 224 is coupled to the local controller 212 of the RF generator 132 via a cable 227, e.g., a cable that facilitates a parallel transfer of data, a cable that facilitates a serial transfer of data, or a universal serial bus (USB) cable.

The host controller 224 includes the computer-generated model 140A. An example of the computer-generated model 140A includes a model of the RF cable 144 and the impedance matching circuit 134, or a model of the RF cable 144, the impedance matching circuit 134, and at least a portion of the RF transmission line 168. The portion of the RF transmission line 168 extends from the output of the impedance matching circuit 134 to a point on the RF transmission line 168.

A computer-generated model of a part of the plasma system 130 has similar structure and function as that of the part. For example, the computer-generated model 140A includes circuit elements that represent the circuit components of a part of the plasma system 130 and the circuit elements have the same connections as that of the circuit components. To illustrate, when a variable capacitor 104 of the impedance matching circuit 134 is coupled in series with an inductor 106 of the impedance matching circuit 134, a variable capacitor that is a computer software representation of the variable capacitor 104 is coupled in series with an inductor that is a computer software representation of the inductor 106. As another illustration, when a variable shunt capacitor 102 of the impedance matching circuit 134 is coupled in a T-configuration with the variable capacitor 104 and the RF cable 144, a variable shunt capacitor of the computer-generated model 140A that is a computer software representation of the variable shunt capacitor 102 is coupled in a T-configuration with a variable capacitor that is a computer software representation of the variable capacitor 104 and an RF cable model that is a computer software representation of the RF cable 144. As yet another illustration, when a first capacitor of the impedance matching circuit 134 is coupled in parallel with a second capacitor of the impedance matching circuit 134, a capacitor that is a computer software representation of the first capacitor is coupled in parallel with a capacitor that is a computer software representation of the second capacitor. As another example, a computer-generated model has similar characteristics, e.g., capacitance, resistance, inductance, impedance, complex voltage and current, etc., as that of the part that is represented by the model. The inductor 106 is coupled in series with the RF transmission line 168 and the variable capacitor 104 is coupled to the RF cable 144.

In some embodiments, a complex voltage and current includes a magnitude of a current, a magnitude of a voltage, and a phase between the current and the voltage.

Examples of a part of a plasma system include an RF cable, or an impedance matching circuit that is coupled to the RF cable, or an RF transmission line that is coupled to the impedance matching circuit, or a chuck that is coupled to the RF transmission line, or a combination thereof. Examples of a circuit component of a part of a plasma system include a capacitor, an inductor, and a resistor. Examples of a circuit element of a computer-generated model include a capacitor, an inductor, and a resistor.

In some embodiments, a circuit element of a computer-generated model represents a circuit component of a part of the plasma system 130 when the circuit element has similar characteristics, e.g., capacitance, impedance, inductance, or a combination thereof, etc., as that of the circuit component. For example, an inductor of the computer-generated model 140A has the same inductance as that of the inductor 106. As another example, a variable capacitor of the computer-generated model 140A has the same capacitance as that of the variable capacitor 104. As yet another example, a capacitance of a variable capacitor of the computer-generated model 140A has the same capacitance as that of the variable capacitor 102.

A computer-generated model is generated by a processor of the host controller 224.

The processor of the host controller 224 includes a recipe for generating plasma within the plasma chamber 122 and modifying properties, e.g., impedance, uniformity, etc., of the plasma. In some embodiments, a recipe includes a power and frequency of operation of the RF generator 132. The processor of the host controller 224 sends the power and frequency of operation via the cable 227 to the local controller 212 for operating the RF generator 232 at the power and frequency. When the RF generator 232 operates at the power and frequency, the RF generator 232 produces an RF signal having the power and frequency.

A recipe 226A of the host controller 224 includes an impedance to be achieved, e.g., a desirable impedance, etc., at the point on the RF transmission line 168 between an output of the impedance matching circuit 134 and the chuck 218. The point is located at an output of the impedance matching circuit 134, or on the RF transmission line 168, or at an input of the chuck 222. The recipe 226A includes a correspondence, e.g., a relationship, a link, a one-to-one relationship, a one-to-one tabular relationship, a one-to-one relationship within a table, etc., between an impedance at the point, e.g., the desirable impedance, etc., and an impedance at an output 142A of the computer-generated model 140A. In some embodiments, a recipe includes a portion of a table or a table.

In various embodiments, instead of a correspondence between impedance at the point and impedance at the output 142A of the computer-generated model 140A, the recipe 226A includes a correspondence between a value of another variable at the output 142A of the computer-generated model 140A and a value of the other variable at the point between the impedance matching circuit 134 and the upper electrode 220. Examples of other variables include voltage, current, etch rate, gamma, deposition rate, complex voltage and current, etc.

In some embodiments, the desirable impedance to be achieved is at the point and the computer-generated model 140A is a model of parts of the plasma system 130 between the output 172 of the RF generator 132 and the point on the RF transmission line 168. For example, when the desirable impedance to be achieved is at an input of the RF strap of the RF transmission line 168, the computer-generated model 140A is of the RF cable 144, the impedance matching circuit 134, and of a portion of the RF transmission line 168 that includes the tunnel. As another example, when the desirable impedance to be achieved is at the input of the chuck 218, the computer-generated model 140A is of the RF cable 144, the impedance matching circuit 134, and the RF transmission line 168.

The host controller 224 retrieves parameters, e.g., frequency, power, etc., from a memory device of the host controller 224 and provides the parameters to the local controller 212 of the RF generator 132. The local controller 212 receives the parameters and provides the parameters to the RF power supply 216, which generates an RF signal, e.g., a pulsed signal, a non-pulsed signal, etc., having the parameters.

In some embodiments, the local controller 212 includes a look-up table that includes a correspondence between the parameters and parameters to be provided to the RF power supply 216. Instead of the parameters received from the host controller 224, the local controller 212 looks-up parameters, e.g., frequency, power, etc., corresponding to the received parameters and provides the looked-up parameters to the RF power supply 216.

The impedance matching circuit 134 receives the RF signal from the RF generator 132 and matches an impedance of a load connected to the impedance matching circuit 134 and a source connected to the impedance matching circuit 104 to generate a modified RF signal. Examples of the source include the RF generator 132, or the RF cable 144, or a combination thereof. Examples of the load include the RF transmission line 168, or the plasma chamber 122, or a combination thereof.

The chuck 218 receives the modified RF signal via the RF transmission line 168 from the impedance matching circuit 134 and upon an introduction of a process gas within the plasma chamber 122, plasma is generated within the plasma chamber 122. Examples of the process gas include an oxygen-containing gas, such as $O_2$. Other examples of the process gas include a fluorine-containing gas, e.g., tetrafluoromethane ($CF_4$), sulfur hexafluoride ($SF_6$), hexafluoroethane ($C_2F_6$), etc.

The plasma is used to process the work piece 120. For example, the plasma is used to etch the work piece 120, or etch a material deposited on the work piece 120, or deposit a material on the work piece 120, or clean the work piece 120, etc.

When the work piece 120 is being processed by supply of an RF signal, the impedance at the output 142A of the computer-generated model 140A is generated by the host controller 224 by propagating a complex voltage and current that is measured by the sensor 214 at the output 172 of the RF generator 132 via the computer-generated model 140A. For example, a directional sum of the complex voltage and current at the output 172 of the RF generator 132 and of complex voltages and currents of electrical circuit components of the computer-generated model 140A is calculated by the host controller 224 to generate a complex voltage and current at the output 142A of the computer-generated model 140A and the impedance at the output 172 of the RF generator 132 is calculated from the complex voltage and current at the output 142A.

In the embodiments in which the other variables at the output 142A are used, the other variables are calculated by the host controller 224 based on the complex voltage and current at the output 142A.

When the impedance matching circuit 134 receives the RF signal from the RF generator 132, the host controller 224 determines whether the desirable impedance at the point between the impedance matching circuit 134 and the chuck 218 matches an impedance at the output 142A of the computer-generated model 140A. Upon determining that the desirable impedance at the point does not match the impedance at the output 142A, the host controller 224 adjusts a real portion of the impedance at the output 142A by changing a capacitance of the variable shunt capacitor 102. The host controller 224 changes the capacitance of the variable shunt capacitor 102 to match the real portion of the impedance of the output 142A with a real portion of the desirable impedance at the point. The match between the real portion of the impedance at the output 142A and the real portion of the desirable impedance at the point on the RF transmission line 168 occurs to achieve an etch rate, or a deposition rate, or a gamma value, or a combination thereof. Gamma is described below.

Moreover, in some embodiments, upon determining that the desirable impedance at the point does not match the impedance at the output 142A, the host controller 224 adjusts an imaginary portion of the impedance at the output 142A by changing a capacitance of the variable capacitor 104. The host controller 224 changes the capacitance of the variable capacitor 104 to achieve a match between an imaginary portion of the impedance at the output 142A with that of an imaginary portion of the desirable impedance. The match between the imaginary portion of the impedance at the output 142A and the imaginary portion of the desirable impedance at the point on the RF transmission line 168 occurs to achieve an etch rate or a deposition rate or a combination thereof.

In various embodiments, a capacitance of the variable capacitor 104 is adjusted instead of or in addition to a capacitance of the variable shunt capacitor 102 to match an impedance at the output 142A of the computer-generated model 140A with the desirable impedance at the point.

In some embodiments, the point on the RF transmission line 168 includes a point at an output of an impedance matching circuit connected to the RF transmission line 168 or a point at an input of the chuck 218.

In some embodiments, instead of using the impedance at the output 142A of the computer-generated model 140A, a sensor (not shown) is coupled to the point on the RF transmission line 168 and is used to measure an impedance at the point. The sensor (not shown) is coupled to the host controller 224 to provide the measured impedance to the host controller 224. The host controller 224 determines whether the measured impedance matches the desirable impedance to be achieved at the point. Upon determining that the measured impedance does not match the desirable impedance at the point, the host controller 224 adjusts a real portion of the impedance at the output 142A by changing a capacitance of the variable shunt capacitor 102. The host controller 224 changes the capacitance of the variable shunt capacitor 102 to match the real portion of the measured impedance with a real portion of the desirable impedance. The match between the real portion of the measured impedance and the real portion of the desirable impedance at the point on the RF transmission line 168 occurs to achieve an etch rate or a deposition rate or a combination thereof.

Moreover, in several embodiments, upon determining that the desirable impedance at the point does not match the measured impedance, the host controller 224 adjusts an imaginary portion of the measured impedance obtained from the sensor (not shown) coupled to the point by changing a capacitance of the variable capacitor 104. The host controller 224 changes the capacitance of the variable capacitor 104 to achieve a match between an imaginary portion of the measured impedance received from the sensor (not shown) and an imaginary portion of the desirable impedance. The match between the imaginary portion of the measured impedance and the imaginary portion of the desirable impedance at the point on the RF transmission line 168 occurs to achieve an etch rate or a deposition rate or a combination thereof.

In various embodiments, a capacitance of the variable capacitor 104 is adjusted instead of or in addition to a capacitance of the variable shunt capacitor 102 to match the measured impedance received from the sensor (not shown) with the desirable impedance.

It should be noted that in some embodiments, the variable shunt capacitor 102 and the inductor 106 are in the impedance matching circuit 134 at a time the variable capacitor 104 is added to the impedance matching circuit 134. For example, the impedance matching circuit 134 matches an impedance of the load connected at one end to the impedance matching circuit 134 with an impedance of the source connected at another end to the impedance matching circuit 134 by using the variable shunt capacitor 102 and the inductor 106 before the variable capacitor 104 is included within the impedance matching circuit 134.

In various embodiments, the operations, described herein, as being performed by the host controller 224 are performed by one or more processors of the host controller 224.

In some embodiments, in place of the variable shunt capacitor 102, a variable inductor (not shown) is used and an inductance of the variable inductor is changed to match a real portion of an impedance at an output of a computer-generated model with a real portion of an impedance to be achieved at the point on the RF transmission line 168 or with that of an impedance measured by a sensor (not shown) at the point.

Figure 2:
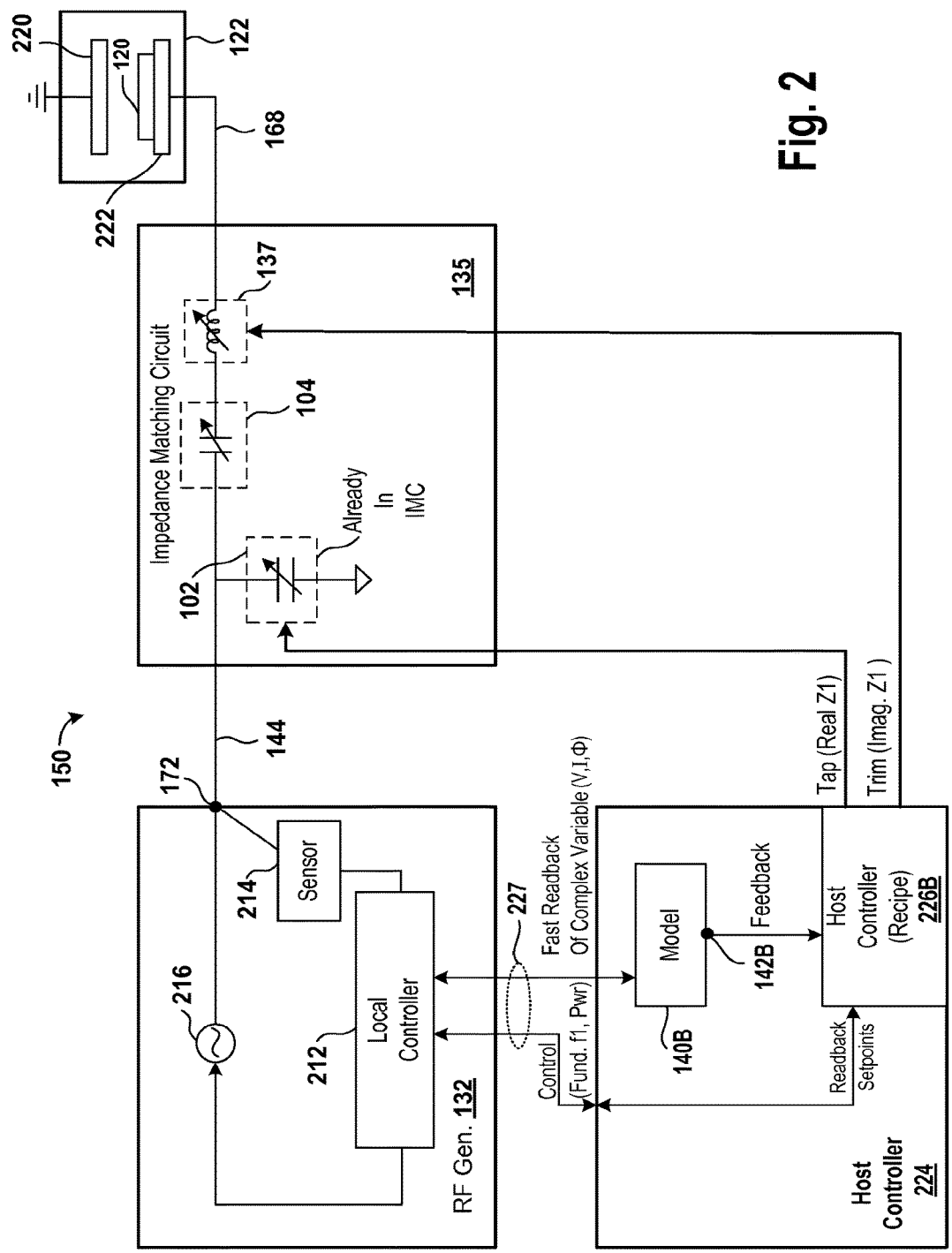
FIG. 2 is a diagram of a plasma system for controlling a rate of etching or depositing using a computer-generated model and an impedance matching circuit, in accordance with an embodiment described in the present disclosure.

FIG. 2 is a diagram of an embodiment of a plasma system 150 for controlling a rate of etching or depositing using a computer-generated model 140B and an impedance matching circuit 135. An example of the computer-generated model 140B includes a model of the RF cable 144 and the impedance matching circuit 135, or a model of the RF cable 144, the impedance matching circuit 135, and at least a portion of the RF transmission line 168. The computer-generated model 140B is generated from the impedance matching circuit 135 in a manner similar to that of generating the computer-generated model 140A (FIG. 1) from the impedance matching circuit 134 (FIG. 1). The plasma system 150 is similar to the plasma system 130 (FIG. 1) except that the plasma system 150 includes the impedance matching circuit 135, which includes a variable inductor 137 instead of the fixed inductor 106 (FIG. 1), except that the plasma system 150 includes the computer-generated model 140B instead of the computer-generated model 140A, and except that the plasma system 150 includes a recipe 226B instead of the recipe 226A (FIG. 1).

The recipe 226B of the host controller 224 also includes impedance to be achieved, e.g., the desirable impedance, etc., at the point on the RF transmission line 168 between an output of the impedance matching circuit 135 and the chuck 218. The recipe 226B includes a correspondence between an impedance at the point on the RF transmission line 168 and an impedance at an output 142B of the computer-generated model 140B.

In some embodiments, instead of a correspondence between impedance at the point on the RF transmission line 168 and impedance at the output 142B, the recipe 226B includes a correspondence between a value of another variable at the output 142B and a value of the other variable at the point between the impedance matching circuit 135 and the upper electrode 220.

The variable inductor 137 is coupled in series with the variable capacitor 104 and with the RF transmission line 168.

Moreover, in some embodiments, upon determining that the desirable impedance at the point does not match the impedance at the output 142B of the computer-generated model 140B, the host controller 224 adjusts an imaginary portion of the impedance at the output 142B by changing an inductance of the variable inductor 137. The host controller 224 changes the inductance of the variable inductor 137 to achieve a match between an imaginary portion of the impedance at the output 142B and an imaginary portion of the desirable impedance at the point.

In various embodiments, an inductance of the variable inductor 137 is adjusted instead of or in addition to a capacitance of the variable shunt capacitor 102 to match an impedance at the output 142B of the computer-generated model 140B with the desirable impedance.

In several embodiments, upon determining that the desirable impedance at the point does not match the impedance at the output 142B, the host controller 224 adjusts an imaginary portion of the impedance at the output 142B by changing an inductance of the variable inductor 137 and by changing a capacitance of the variable capacitor 104. The host controller 224 changes the inductance of the variable inductor 137 and the capacitance of the variable capacitor 104 to achieve a match between an imaginary portion of the impedance at the output 142B and an imaginary portion of the desirable impedance at the point on the RF transmission line 168.

In various embodiments, an inductance of the variable inductor 137 and the capacitance of the variable capacitor 104 are adjusted instead of or in addition to a capacitance of the variable shunt capacitor 102 to match an impedance at the output 142B of the computer-generated model 140B with the desirable impedance at the point on the RF transmission line 168.

In some embodiments, instead of using the impedance at the output 142B of the computer-generated model 140B, the sensor (not shown) is coupled to the point on the RF transmission line 168 and is used to measure an impedance at the point on the RF transmission line 168. The sensor (not shown) provides the measured impedance to the host controller 224. The host controller 224 determines whether the measured impedance matches the desirable impedance to be achieved at the point. Upon determining that the measured impedance does not match the desirable impedance at the point, the host controller 224 adjusts an imaginary portion of the impedance at the output 142B by changing an inductance of the variable inductor 137. The host controller 224 changes the inductance of the variable inductor 137 to match the imaginary portion of the measured impedance received from the sensor (not shown) with an imaginary portion of the desirable impedance.

In various embodiments, an inductance of the variable inductor 137 is adjusted instead of or in addition to a capacitance of the variable shunt capacitor 102 to match the measured impedance received from the sensor (not shown) with the desirable impedance.

In some embodiments, upon determining that the measured impedance received from the sensor (not shown) does not match the desirable impedance at the point, the host controller 224 adjusts an imaginary portion of the impedance at the output 142B by changing an inductance of the variable inductor 137 and by changing a capacitance of the variable capacitor 104. The host controller 224 changes the inductance of the variable inductor 137 and the capacitance of the variable capacitor 104 to match the imaginary portion of the measured impedance received from the sensor (not shown) with an imaginary portion of the desirable impedance at the point on the RF transmission line 168.

In various embodiments, an inductance of the variable inductor 137 and a capacitance of the variable capacitor 104 are adjusted instead of or in addition to a capacitance of the variable shunt capacitor 102 to match the measured impedance received from the sensor (not shown) with the desirable impedance at the point on the RF transmission line 168.

It should be noted that in some embodiments, the variable shunt capacitor 102 and the variable inductor 137 are in the impedance matching circuit 135 at a time the variable capacitor 104 is added to the impedance matching circuit 135. For example, the impedance matching circuit 135 matches an impedance of a load connected at one end to the impedance matching circuit 135 with an impedance of a source connected at another end to the impedance matching circuit 135 by using the variable shunt capacitor 102 and the variable inductor 137 before the variable capacitor 104 is included within the impedance matching circuit 135.

Figure 3:
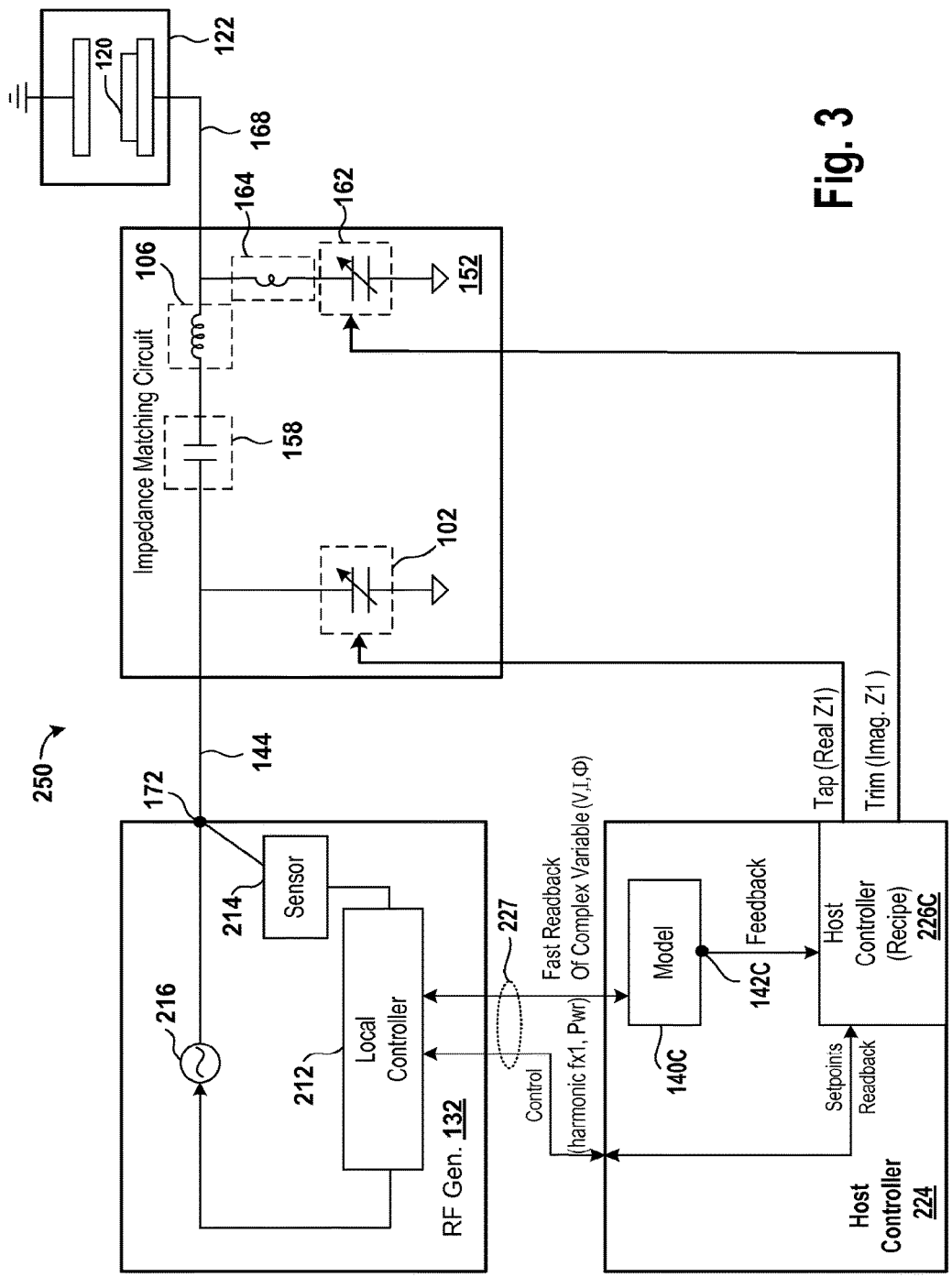
FIG. 3 is a diagram of a plasma system for controlling a rate of etching or depositing using a computer-generated model and an impedance matching circuit, in accordance with an embodiment described in the present disclosure.

FIG. 3 is a diagram of an embodiment of a plasma system 250 for controlling a rate of etching or depositing using a computer-generated model 140C and an impedance matching circuit 152. An example of the computer-generated model 140C includes a model of the RF cable 144 and the impedance matching circuit 152, or a model of the RF cable 144, the impedance matching circuit 152, and at least a portion of the RF transmission line 168. The computer-generated model 140C is generated from the impedance matching circuit 152 in a manner similar to that of generating the computer-generated model 140A (FIG. 1) from the impedance matching circuit 134 (FIG. 1). The plasma system 250 is similar to the plasma system 130 (FIG. 1) except the impedance matching circuit 152 includes a capacitor 158 in place of the variable capacitor 104, includes a variable shunt capacitor 162, and includes an inductor 164. The capacitor 158 is in series with the inductor 106 and is connected to the RF cable 144. Moreover, the inductor 164 is coupled in a T-configuration with the inductor 106 and the RF transmission line 168. The variable capacitor 162 is coupled in series with the inductor 164.

The plasma system 250 is similar to the plasma system 130 (FIG. 1) except that the plasma system 250 includes the computer-generated model 140C instead of the computer-generated model 140A, and except that the plasma system 250 includes a recipe 226C instead of the recipe 226A (FIG. 1).

The recipe 226C of the host controller 224 also includes an impedance to be achieved, e.g., the desirable impedance, etc., at the point on the RF transmission line 168 between an output of the impedance matching circuit 152 and the chuck 218. The recipe 226C includes a correspondence between an impedance at the point on the RF transmission line 168 and an impedance at an output 142C of the computer-generated model 140C.

In some embodiments, instead of a correspondence between impedance at the point and impedance at the output 142C, the recipe 226C includes a correspondence between a value of another variable at the output 142C and a value of the other variable at the point between the impedance matching circuit 152 and the upper electrode 220.

In some embodiments, upon determining that the desirable impedance at the point does not match the impedance at the output 142C of the computer-generated model 140C, the host controller 224 adjusts an imaginary portion of the impedance at the output 142C by changing a capacitance of the variable shunt capacitor 162. The host controller 224 changes the capacitance of the variable shunt capacitor 162 to achieve a match between an imaginary portion of the impedance at the output 142C and an imaginary portion of the desirable impedance at the point on the RF transmission line 168.

In various embodiments, a capacitance of the variable shunt capacitor 162 is adjusted instead of or in addition to a capacitance of the variable shunt capacitor 102 to match an impedance at the output 142C of the computer-generated model 140C with the desirable impedance at the point on the RF transmission line 168.

In several embodiments, a variable capacitor (not shown) is used in place of the capacitor 158. A capacitance of the variable capacitor (not shown) and the capacitance of the variable shunt capacitor 162 are adjusted to match an imaginary portion of the impedance at the output 142C of the computer-generated model 140C with an imaginary portion of the desirable impedance at the point on the RF transmission line 168.

In various embodiments, a variable capacitor (not shown) is used in place of the capacitor 158. A capacitance of the variable capacitor (not shown) and the capacitance of the variable shunt capacitor 162 are adjusted in addition to a capacitance of the variable shunt capacitor 102 to match an impedance at the output 142C of the computer-generated model 140C with the desirable impedance at the point on the RF transmission line 168.

In some embodiments, a variable inductor (not shown) is used in place of the inductor 106. An inductance of the variable inductor (not shown) and the capacitance of the variable shunt capacitor 162 are adjusted to match an imaginary portion of the impedance at the output 142C of the computer-generated model 140C with an imaginary portion of the desirable impedance at the point on the RF transmission line 168.

In various embodiments, a variable inductor (not shown) is used in place of the inductor 106. An inductance of the variable inductor (not shown) and the capacitance of the variable shunt capacitor 162 are adjusted in addition to a capacitance of the variable shunt capacitor 102 to match an impedance at the output 142C of the computer-generated model 140C with the desirable impedance at the point on the RF transmission line 168.

In some embodiments, a variable capacitor (not shown) is used in place of the capacitor 158 and a variable inductor (not shown) is used in place of the inductor 106. A capacitance of the variable capacitor (not shown), an inductance of the variable inductor (not shown), and the capacitance of the variable shunt capacitor 162 are adjusted to match an imaginary portion of the impedance at the output 142C of the computer-generated model 140C with an imaginary portion of the desirable impedance.

In some embodiments, instead of using the impedance at the output 142C of the computer-generated model 140C, the sensor (not shown) is coupled to the point on the RF transmission line 168 and is used to measure an impedance at the point. The sensor (not shown) provides the measured impedance to the host controller 224. The host controller 224 determines whether the measured impedance matches the desirable impedance to be achieved at the point on the RF transmission line 168. Upon determining that the measured impedance does not match the desirable impedance at the point, the host controller 224 adjusts an imaginary portion of the impedance at the output 142C by changing a capacitance of the variable shunt capacitor 162. The host controller 224 changes the capacitance of the variable shunt capacitor 162 to match the imaginary portion of the measured impedance received from the sensor (not shown) with an imaginary portion of the desirable impedance at the point on the RF transmission line 168.

In various embodiments, a capacitance of the variable shunt capacitor 162 is adjusted in addition to a capacitance of the variable shunt capacitor 102 to match the measured impedance received from the sensor (not shown) with the desirable impedance at the point on the RF transmission line 168.

In the embodiments in which the variable capacitor (not shown) is used in place of the capacitor 158, upon determining that the measured impedance does not match the desirable impedance at the point, the host controller 224 adjusts an imaginary portion of the impedance at the output 142C by changing a capacitance of the variable capacitor (not shown) and by changing a capacitance of the variable shunt capacitor 162. The host controller 224 changes the capacitance of the variable capacitor (not shown) and the capacitance of the variable shunt capacitor 162 to match the imaginary portion of the measured impedance received from the sensor (not shown) with an imaginary portion of the desirable impedance at the point on the RF transmission line 168.

In several embodiments, a capacitance of the variable capacitor (not shown) that is connected in place of the capacitor 158 and a capacitance of the variable shunt capacitor 162 are adjusted to match an imaginary portion of the measured impedance received from the sensor (not shown) with an imaginary portion of the desirable impedance at the point on the RF transmission line 168.

In some embodiments, a capacitance of the variable capacitor (not shown) that is connected in place of the capacitor 158 and a capacitance of the variable shunt capacitor 162 are adjusted in addition to a capacitance of the variable shunt capacitor 102 to match the measured impedance received from the sensor (not shown) with the desirable impedance at the point on the RF transmission line 168.

In the embodiments in which the variable inductor (not shown) is used in place of the inductor 106, upon determining that the measured impedance does not match the desirable impedance at the point, the host controller 224 adjusts an imaginary portion of the impedance at the output 142C by changing an inductance of the variable inductor (not shown) and by changing a capacitance of the variable shunt capacitor 162. The host controller 224 changes the inductance of the variable inductor (not shown) and the capacitance of the variable shunt capacitor 162 to match the imaginary portion of the measured impedance received from the sensor (not shown) with an imaginary portion of the desirable impedance at the point on the RF transmission line 168.

In various embodiments, an inductance of the variable inductor (not shown) that is connected in place of the inductor 106 and a capacitance of the variable shunt capacitor 162 are adjusted in addition to a capacitance of the variable shunt capacitor 102 to match the measured impedance received from the sensor (not shown) with the desirable impedance at the point on the RF transmission line 168.

In some embodiments the variable inductor (not shown) is used in place of the inductor 106 and the variable capacitor (not shown) is used in place of the capacitor 158. Upon determining that the measured impedance does not match the desirable impedance at the point, the host controller 224 adjusts an imaginary portion of the impedance at the output 142C by changing an inductance of the variable inductor (not shown), by changing a capacitance of the variable capacitor (not shown) and by changing a capacitance of the variable shunt capacitor 162. The host controller 224 changes the inductance of the variable inductor (not shown), the capacitance of the variable capacitor (not shown) and the capacitance of the variable shunt capacitor 162 to match the imaginary portion of the measured impedance received from the sensor (not shown) with an imaginary portion of the desirable impedance at the point on the RF transmission line 168.

In various embodiments, an inductance of the variable inductor (not shown) that is connected in place of the inductor 106, a capacitance of the variable capacitor (not shown) that is connected in place of the capacitor 158, and a capacitance of the variable shunt capacitor 162 are adjusted in addition to a capacitance of the variable shunt capacitor 102 to match an imaginary portion of the measured impedance received from the sensor (not shown) with an imaginary portion of the desirable impedance at the point on the RF transmission line 168.

It should be noted that in some embodiments, the variable shunt capacitor 102, the capacitor 158, and the inductor 106 are in the impedance matching circuit 152 at a time the inductor 164 and the variable shunt capacitor 162 are added to the impedance matching circuit 152. For example, the impedance matching circuit 152 matches an impedance of a load connected at one end to the impedance matching circuit 152 with an impedance of a source connected at another end to the impedance matching circuit 152 by using the variable shunt capacitor 102, the capacitor 158, and the inductor 106 before the inductor 164 and the variable shunt capacitor 162 are included within the impedance matching circuit 152.

Figure 4:
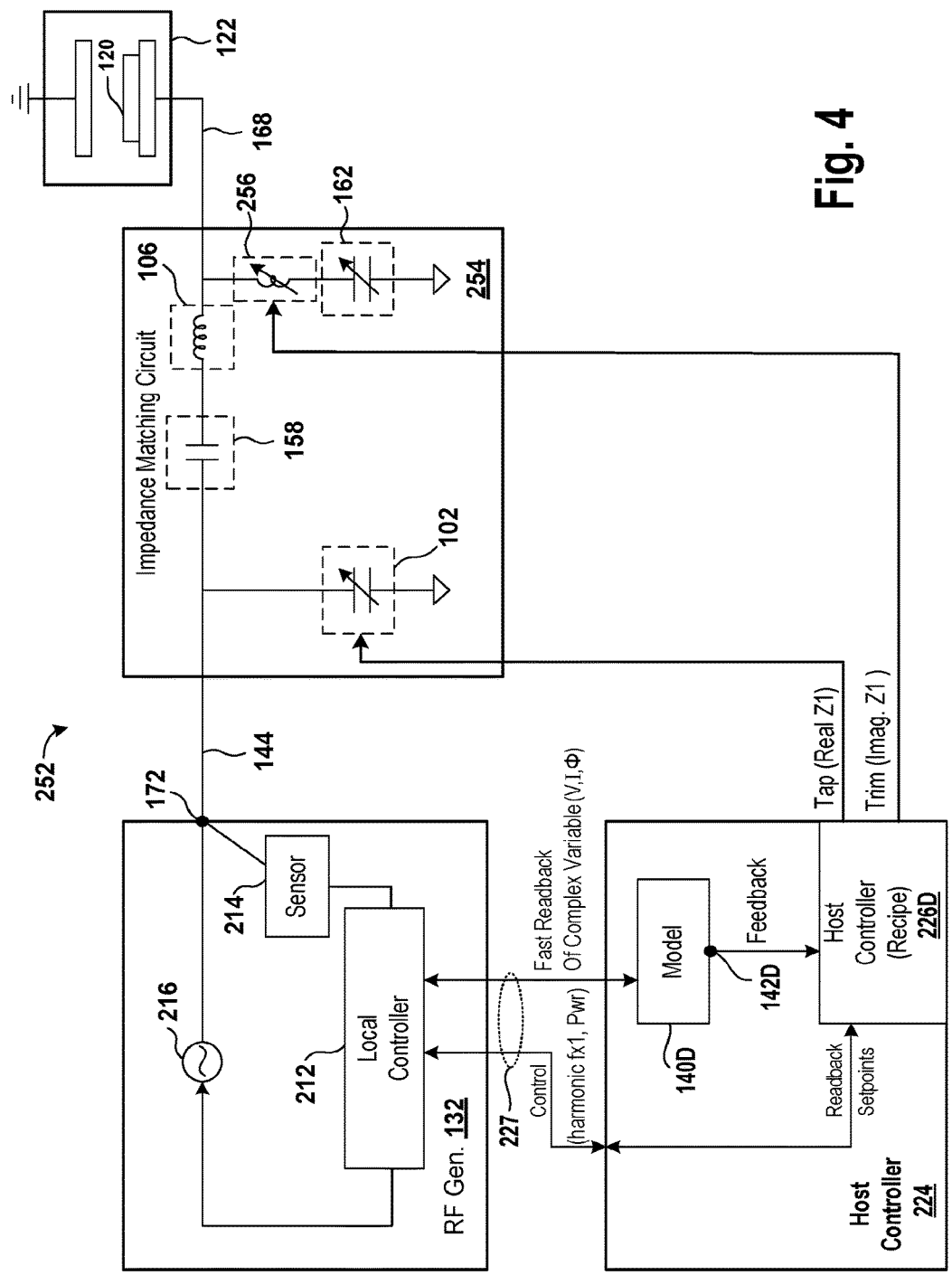
FIG. 4 is a diagram of a plasma system for controlling a rate of etching or depositing using a computer-generated model and an impedance matching circuit, in accordance with an embodiment described in the present disclosure.

FIG. 4 is a diagram of an embodiment of a plasma system 252 for controlling a rate of etching or depositing using a computer-generated model 140D and an impedance matching circuit 254. An example of the computer-generated model 140D includes a model of the RF cable 144 and the impedance matching circuit 254, or a model of the RF cable 144, the impedance matching circuit 254, and at least a portion of the RF transmission line 168. The computer-generated model 140D is generated from the impedance matching circuit 254 in a manner similar to that of generating the computer-generated model 140c (FIG. 3) from the impedance matching circuit 152 (FIG. 3). The plasma system 252 is similar to the plasma system 250 (FIG. 3) except the impedance matching circuit 254 includes a variable inductor 256 in place of the inductor 164. The variable inductor 256 is in series with the variable capacitor 162 and forms a T-configuration with the inductor 106 and the RF transmission line 168.

The plasma system 252 is similar to the plasma system 250 except that the plasma system 252 includes the computer-generated model 140D instead of the computer-generated model 140C, and except that the plasma system 252 includes a recipe 226D instead of the recipe 226C (FIG. 3).

The recipe 226D of the host controller 224 includes an impedance to be achieved, e.g., the desirable impedance, etc., at the point on the RF transmission line 168 between an output of the impedance matching circuit 254 and the chuck 218. The recipe 226D includes a correspondence between an impedance at the point on the RF transmission line 168 and an impedance at an output 142D of the computer-generated model 140D.

In some embodiments, instead of a correspondence between impedance at the point on the RF transmission line 168 and impedance at the output 142D, the recipe 226D includes a correspondence between a value of another variable at the output 142D and a value of the other variable at the point between the impedance matching circuit 254 and the upper electrode 220.

In some embodiments, upon determining that the desirable impedance at the point does not match the impedance at the output 142D of the computer-generated model 140D, the host controller 224 adjusts an imaginary portion of the impedance at the output 142D by changing an inductance of the variable inductor 256. The host controller 224 changes the inductance of the variable inductor 256 to achieve a match between an imaginary portion of the impedance at the output 142D and an imaginary portion of the desirable impedance at the point on the RF transmission line 168.

In several embodiments, upon determining that the desirable impedance at the point does not match the impedance at the output 142D of the computer-generated model 140D, the host controller 224 adjusts an imaginary portion of the impedance at the output 142D by changing an inductance of the variable inductor 256 and by changing a capacitance of the variable shunt capacitor 162. The host controller 224 changes the inductance of the variable inductor 256 and the capacitance of the variable shunt capacitor 162 to achieve a match between an imaginary portion of the impedance at the output 142D and an imaginary portion of the desirable impedance at the point on the RF transmission line 168.

In various embodiments, an inductance of the variable inductor 256 is adjusted instead of or in addition to a capacitance of the variable shunt capacitor 102 to match an impedance at the output 142D of the computer-generated model 140D with the desirable impedance at the point on the RF transmission line 168.

In several embodiments, upon determining that the desirable impedance at the point does not match the impedance at the output 142D, the host controller 224 adjusts an imaginary portion of the impedance at the output 142D by changing an inductance of the variable inductor 256, a capacitance of the variable shunt capacitor 162, and by changing a capacitance of the variable shunt capacitor 102. The host controller 224 changes the capacitance of the variable shunt capacitor 162, the inductance of the variable inductor 256, and the capacitance of the variable shunt capacitor 102 to achieve a match between an imaginary portion of the impedance at the output 142D and an imaginary portion of the desirable impedance at the point on the RF transmission line 168.

In various embodiments, a variable capacitor (not shown) is used in place of the capacitor 158. A capacitance of the variable capacitor (not shown) and the inductance of the variable inductor 256 are adjusted to match an imaginary portion of the impedance at the output 142D of the computer-generated model 140D with an imaginary portion of the desirable impedance at the point on the RF transmission line 168.

In some embodiments, a variable capacitor (not shown) is used in place of the capacitor 158. A capacitance of the variable capacitor (not shown) and the inductance of the variable inductor 256 are adjusted in addition to a capacitance of the variable shunt capacitor 102 to match an impedance at the output 142D of the computer-generated model 140D with the desirable impedance at the point on the RF transmission line 168.

In several embodiments, a variable inductor (not shown) is used in place of the inductor 106. An inductance of the variable inductor (not shown) and the inductance of the variable inductor 256 are adjusted to match an imaginary portion of the impedance at the output 142D of the computer-generated model 140D with an imaginary portion of the desirable impedance at the point on the RF transmission line 168.

In some embodiments, a variable inductor (not shown) is used in place of the inductor 106. An inductance of the variable inductor (not shown) and the inductance of the variable inductor 256 are adjusted in addition to a capacitance of the variable shunt capacitor 102 to match an impedance at the output 142D of the computer-generated model 140D with the desirable impedance at the point on the RF transmission line 168.

In some embodiments, a variable capacitor (not shown) is used in place of the capacitor 158 and a variable inductor (not shown) is used in place of the inductor 106. A capacitance of the variable capacitor (not shown), an inductance of the variable inductor (not shown), and the inductance of the variable inductor 256 are adjusted to match an imaginary portion of the impedance at the output 142D of the computer-generated model 140D with an imaginary portion of the desirable impedance at the point on the RF transmission line 168.

In some embodiments, a variable capacitor (not shown) is used in place of the capacitor 158 and a variable inductor (not shown) is used in place of the inductor 106. A capacitance of the variable capacitor (not shown), an inductance of the variable inductor (not shown), and the inductance of the variable inductor 256 are adjusted in addition to a capacitance of the variable shunt capacitor 102 to match an impedance at the output 142D of the computer-generated model 140D with the desirable impedance at the point on the RF transmission line 168.

In various embodiments, a variable capacitor (not shown) is used in place of the capacitor 158. A capacitance of the variable capacitor (not shown), the capacitance of the variable shunt capacitor 162 and the inductance of the variable inductor 256 are adjusted in addition to a capacitance of the variable shunt capacitor 102 to match an impedance at the output 142D of the computer-generated model 140D with the desirable impedance at the point on the RF transmission line 168.

In some embodiments, a variable capacitor (not shown) is used in place of the capacitor 158 and a variable inductor (not shown) is used in place of the inductor 106. A capacitance of the variable capacitor (not shown), an inductance of the variable inductor (not shown), the capacitance of the variable shunt capacitor 162, and the inductance of the variable inductor 256 are adjusted to match an imaginary portion of an impedance at the output 142D of the computer-generated model 140D with an imaginary portion of the desirable impedance at the point on the RF transmission line 168.

In some embodiments, a variable capacitor (not shown) is used in place of the capacitor 158 and a variable inductor (not shown) is used in place of the inductor 106. A capacitance of the variable capacitor (not shown), an inductance of the variable inductor (not shown), the capacitance of the variable shunt capacitor 162, and the inductance of the variable inductor 256 are adjusted in addition to a capacitance of the variable shunt capacitor 102 to match an impedance at the output 142D of the computer-generated model 140D with the desirable impedance at the point on the RF transmission line 168.

In some embodiments, instead of using the impedance at the output 142D of the computer-generated model 140D, the sensor (not shown) is coupled to the point on the RF transmission line 168 and is used to measure an impedance at the point. The sensor (not shown) provides the measured impedance to the host controller 224. The host controller 224 determines whether the measured impedance matches the desirable impedance to be achieved at the point on the RF transmission line 168. Upon determining that the measured impedance does not match the desirable impedance at the point, the host controller 224 adjusts an imaginary portion of the impedance at the output 142D by changing an inductance of the variable inductor 256. The host controller 224 changes the inductance of the variable inductor 256 to match an imaginary portion of the measured impedance with an imaginary portion of the desirable impedance at the point on the RF transmission line 168.

In various embodiments, an inductance of the variable inductor 256 is adjusted instead of or in addition to a capacitance of the variable shunt capacitor 102 to match the measured impedance received from the sensor with the desirable impedance at the point on the RF transmission line 168.

In the embodiments in which the variable capacitor (not shown) is used in place of the capacitor 158, upon determining that the measured impedance does not match the desirable impedance at the point, the host controller 224 adjusts an imaginary portion of the impedance at the output 142D by changing a capacitance of the variable capacitor (not shown) and by changing an inductance of the variable inductor 256. The host controller 224 changes the capacitance of the variable capacitor (not shown) and the inductance of the variable inductor 256 to match an imaginary portion of the measured impedance received from the sensor (not shown) with an imaginary portion of the desirable impedance at the point on the RF transmission line 168.

In various embodiments, a capacitance of the variable capacitor (not shown) that is connected in place of the capacitor 158 and an inductance of the variable inductor 256 are adjusted in addition to a capacitance of the variable shunt capacitor 102 to match the measured impedance received from the sensor (not shown) with the desirable impedance at the point on the RF transmission line 168.

In the embodiments in which the variable inductor (not shown) is used in place of the inductor 106, upon determining that the measured impedance does not match the desirable impedance at the point, the host controller 224 adjusts an imaginary portion of the impedance at the output 142D by changing an inductance of the variable inductor (not shown) and by changing an inductance of the variable inductor 256. The host controller 224 changes the inductance of the variable inductor (not shown) and the inductance of the variable inductor 256 to match an imaginary portion of the measured impedance received from the sensor (not shown) with an imaginary portion of the desirable impedance at the point on the RF transmission line 168.

In various embodiments, an inductance of the variable inductor (not shown) that is connected in place of the inductor 106 and an inductance of variable inductor 256 are adjusted in addition to a capacitance of the variable shunt capacitor 102 to match the measured impedance received from the sensor (not shown) with the desirable impedance at the point on the RF transmission line 168.

In some embodiments the variable inductor (not shown) is used in place of the inductor 106 and the variable capacitor (not shown) is used in place of the capacitor 158. Upon determining that the measured impedance does not match the desirable impedance at the point, the host controller 224 adjusts an imaginary portion of the impedance at the output 142D by changing an inductance of the variable inductor (not shown), by changing a capacitance of the variable capacitor (not shown) and by changing an inductance of the variable inductor 256. The host controller 224 changes the inductance of the variable inductor (not shown), the capacitance of the variable capacitor (not shown) and the inductance of the variable inductor 256 to match an imaginary portion of the measured impedance received from the sensor (not shown) with an imaginary portion of the desirable impedance at the point on the RF transmission line 168.

In various embodiments, an inductance of the variable inductor (not shown) that is connected in place of the inductor 106, a capacitance of the variable capacitor (not shown) that is connected in place of the capacitor 158, and an inductance of the variable inductor 256 are adjusted in addition to a capacitance of the variable shunt capacitor 102 to match the measured impedance received from the sensor (not shown) with the desirable impedance.

In the embodiments in which the variable capacitor (not shown) is used in place of the capacitor 158, upon determining that the measured impedance does not match the desirable impedance at the point, the host controller 224 adjusts an imaginary portion of the impedance at the output 142D by changing a capacitance of the variable capacitor (not shown), by changing a capacitance of the variable shunt capacitor 162, and by changing an inductance of the variable inductor 256. The host controller 224 changes the capacitance of the variable capacitor (not shown), the capacitance of the variable shunt capacitor 162, and the inductance of the variable inductor 256 to match an imaginary portion of the measured impedance received from the sensor (not shown) with an imaginary portion of the desirable impedance at the point on the RF transmission line 168.

In various embodiments, a capacitance of the variable capacitor (not shown) that is connected in place of the capacitor 158, the capacitance of the variable shunt capacitor 162, and an inductance of the variable inductor 256 are adjusted in addition to a capacitance of the variable shunt capacitor 102 to match the measured impedance received from the sensor (not shown) with the desirable impedance at the point on the RF transmission line 168.

In the embodiments in which the variable inductor (not shown) is used in place of the inductor 106, upon determining that the measured impedance received from the sensor (not shown) does not match the desirable impedance at the point on the RF transmission line 168, the host controller 224 adjusts an imaginary portion of the impedance at the output 142D by changing an inductance of the variable inductor (not shown), capacitance of the variable shunt capacitor 162, and by changing an inductance of the variable inductor 256. The host controller 224 changes the inductance of the variable inductor (not shown), the capacitance of the variable shunt capacitor 162, and the inductance of the variable inductor 256 to match an imaginary portion of the measured impedance received from the sensor (not shown) with an imaginary portion of the desirable impedance at the point on the RF transmission line 168.

In various embodiments, an inductance of the variable inductor (not shown) that is connected in place of the inductor 106, the capacitance of the variable shunt capacitor 162, and an inductance of variable inductor 256 are adjusted in addition to a capacitance of the variable shunt capacitor 102 to match the measured impedance received from the sensor with the desirable impedance.

In some embodiments the variable inductor (not shown) is used in place of the inductor 106 and the variable capacitor (not shown) is used in place of the capacitor 158. Upon determining that the measured impedance does not match the desirable impedance at the point, the host controller 224 adjusts an imaginary portion of the impedance at the output 142D by changing an inductance of the variable inductor (not shown), by changing a capacitance of the variable capacitor (not shown), by changing a capacitance of the variable shunt capacitor 162, and by changing an inductance of the variable inductor 256. The host controller 224 changes the inductance of the variable inductor (not shown), the capacitance of the variable capacitor (not shown), the capacitance of the variable shunt capacitor 162, and the inductance of the variable inductor 256 to match an imaginary portion of the measured impedance received from the sensor (not shown) with an imaginary portion of the desirable impedance at the point on the RF transmission line 168.

In various embodiments, an inductance of the variable inductor (not shown) that is connected in place of the inductor 106, a capacitance of the variable capacitor (not shown) that is connected in place of the capacitor 158, a capacitance of the variable shunt capacitor 162, and an inductance of the variable inductor 256 are adjusted in addition to a capacitance of the variable shunt capacitor 102 to match the measured impedance received from the sensor (not shown) with the desirable impedance at the point on the RF transmission line 168.

It should be noted that in some embodiments, the variable shunt capacitor 102, the capacitor 158, and the inductor 106 are in the impedance matching circuit 254 at a time the variable inductor 256 and the variable shunt capacitor 162 are added to the impedance matching circuit 254. For example, the impedance matching circuit 254 matches an impedance of a load connected at one end to the impedance matching circuit 254 with an impedance of a source connected at another end to the impedance matching circuit 254 by using the variable shunt capacitor 102, the capacitor 158, and the inductor 106 before the variable inductor 256 and the variable shunt capacitor 162 are included within the impedance matching circuit 152.

It should further be noted that in various embodiments, a capacitance of the variable capacitor 102 is controlled to change a real portion of an impedance at the point and the real portion is independent of a frequency of an RF signal passing through the point on the RF transmission line 168. In some embodiments, a capacitance of the variable capacitor 104, or an inductance of the variable inductor 137 (FIG. 2), or a capacitance of the variable shunt capacitor 162 (FIG. 3), or an inductance of the variable inductor 256, or a combination thereof is changed to change an imaginary portion of an impedance at the point and the imaginary portion is a function of a harmonic frequency at the point.

In some embodiments, instead of or in addition to changing a capacitance of the variable capacitor 104, and/or an inductance of the variable inductor 137, and/or an inductance of the variable inductor 256, and/or a capacitance of the variable capacitor 162, the host controller 224 sends a signal to the local controller 212 to change, e.g., tune, etc., a harmonic frequency, e.g., a third order harmonic frequency, a fourth order harmonic frequency, a fifth order harmonic frequency, an $m^{th}$ order harmonic frequency, where m is an integer greater than one, etc., associated with the operation of the RF power supply 216. The harmonic frequency is changed to achieve a match between an etch rate calculated based on a complex voltage and current at the output 142D and a pre-determined etch rate. For example, the host controller 224 sends a signal to the local controller 212 to tune a frequency of operation, e.g., a fundamental frequency of operation, etc., of the RF power supply 216. Based on the signal received from the host controller 224, the local controller 212 sends a frequency value to the RF power supply 216 to operate the RF power supply 216 at the frequency value. Upon receiving the frequency value, the RF power supply 216 generates an RF signal having the frequency value. When the RF signal having the frequency value is supplied, a complex voltage and current is measured at the output 172 of the RF generator 132 and a complex voltage and current is determined at the output 142D of the computer-generated model 140D based on the measured complex voltage and current. An etch rate is calculated based on the complex voltage and current determined at the output 142D and is compared to a pre-determined etch rate. Upon determining that the calculated etch rate does not match the pre-determined etch rate, the host controller 224 sends another signal to the local controller 212 to tune a frequency of operation of the RF power supply 216.

Figure 5:
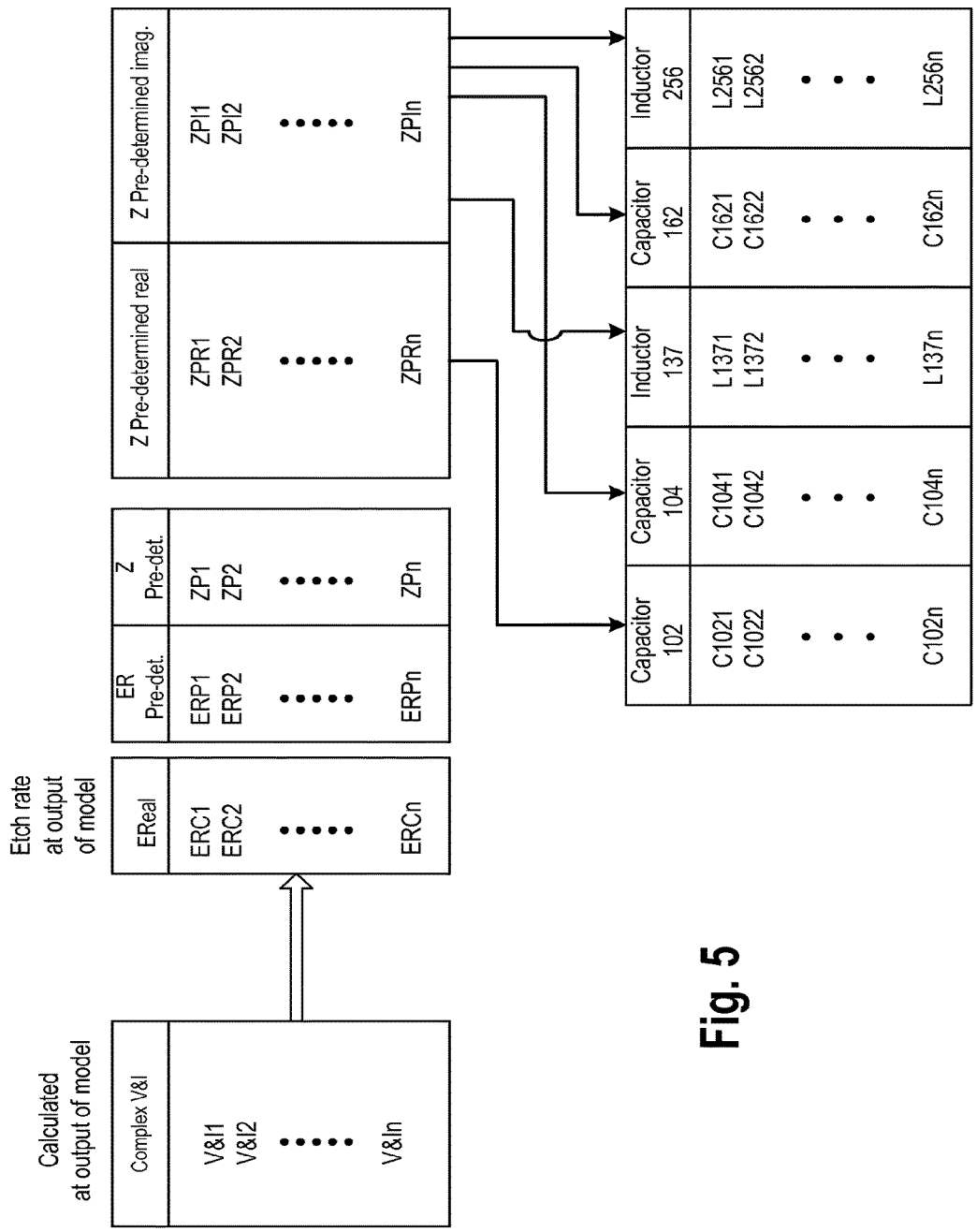
FIG. 5 is diagram of a table used to illustrate determination of capacitance and inductance values of an impedance matching network based on determined complex voltage and current at an output of a computer-generated model, in accordance with an embodiment described in the present disclosure.

FIG. 5 is diagram of an embodiment of a table used to illustrate determination of capacitance and inductance values of an impedance matching network based on determined complex voltage and current at an output of a computer-generated model, e.g., the computer-generated model 140A (FIG. 1), the computer-generated model 140B (FIG. 2), the computer-generated model 140C (FIG. 3), the computer-generated model 140D (FIG. 4), etc. The table of FIG. 5 is stored within a memory device of the host controller 224 (FIG. 1). The complex voltage and current is determined at an output of a computer-generated model.

Moreover, an etch rate at an output of a computer-generated model is identified, e.g. read, retrieved, etc., by the host controller 224 (FIG. 1) based on the complex voltage and current at the output of the computer-generated model. For example, the host controller 224 identifies an etch rate ERC1 as corresponding to a complex voltage and current V&I1, identifies another etch rate ERC2 based on a complex voltage and current V&I2, and so on until the host controller 224 identifies an etch rate ERCn based on a complex voltage and current V&In, where n is an integer greater than two. The complex voltages and currents V&I1, V&I2, until V&In are complex voltages and currents at an output of a computer-generated model.

In some embodiments, a calculated etch rate at an output of a computer-generated model is associated with a pre-determined etch rate to be achieved at the point on the RF transmission line 168. For example, the host controller 224 includes an association between the calculated etch rate ERC1 and a pre-determined etch rate ERP1, between the calculated etch rate ERC2 and a pre-determined etch rate ERP2, and so on until between the calculated etch rate ERCn and a pre-determined etch rate ERPn. In some embodiments, all of etch rates ERP1 thru ERPn have the same value. In various embodiments, ERP1 has a different value than one or more of the remaining pre-determined etch rates ERP2 thru ERPn.

In various embodiments, the pre-determined etch rate ERP1 is within a pre-determined range of the calculated etch rate ERC1, the pre-determined etch rate ERP2 is within the pre-determined range of the calculated etch rate ERC2, and so on until the pre-determined etch rate ERPn is within the pre-determined range of the calculated etch rate ERCn.

In several embodiments, the host controller 224 identifies the pre-determined etch rate based on the calculated etch rate. For example, the host controller 224 determines that the etch rate ERP1 is associated with the etch rate ERC1, the etch rate ERP2 is associated with the etch rate ERC2, and so on until the host controller 224 determines that the etch rate ERPn is associated with the etch rate ERCn.

Each pre-determined impedance ZP to be achieved at the point corresponds to a pre-determined etch rate. For example, a pre-determined impedance ZP1 is calculated by the host controller 224 from the pre-determined etch rate ERP1. As another example, a pre-determined impedance ZP2 is calculated by the host controller 224 from the pre-determined etch rate ERP2 and so on until a pre-determined impedance ZPn is calculated by the host controller 224 from the pre-determined etch rate ERPn. As yet another example, the host controller 224 solves for voltages and currents at different times based on relationships between the voltages, the currents, and pre-determined etch rates at the different times. To further illustrate, the host controller 224 solves for VP1, VP2, IP1, and IP2, in equations $C_{11}VP1+C_{12}IP1=ERP1$ and $C_{11}VP2+C_{12}IP2=ERP1$ to calculate the voltages VP1 and VP2, and the currents IP1 and IP2. The host controller 224 determines a complex pre-determined impedance based on a ratio of the voltage VP1 and the current IP1 and a ratio of the voltage VP2 and current IP2.

In some embodiments, the host controller 224 identifies the pre-determined impedance ZP based on the pre-determined etch rate ERP. For example, the host controller 224 determines the pre-determined impedance ZP1 based on a correspondence between the impedance ZP1 and the etch rate ERP1, determines the pre-determined impedance ZP2 based on a correspondence between the impedance ZP2 and the etch rate ERP2, and so on until the host controller 224 determines the pre-determined impedance ZPn based on a correspondence between the impedance ZPn and the etch rate ERPn.

Each pre-determined impedance has a real portion and an imaginary portion. For example, host controller 224 splits the pre-determined impedance ZP1 into a real portion ZPR1 and an imaginary portion ZPI1, splits the pre-determined impedance ZP2 into a real portion ZPR2 and an imaginary portion ZPI2, and so on until the host controller 224 splits the pre-determined impedance ZPn into a real portion ZPRn and an imaginary portion ZPIn.

In some embodiments, the host controller 224 associates, e.g., links, establishes a connection between, establishes a correspondence between, etc., a real portion of a pre-determined impedance and a capacitance value of the capacitor 102 (FIGS. 1-4) or an inductance value of a variable inductor that is used in place of the variable capacitor 102. For example, the real portion ZPR1 is associated with a capacitance value C1021, the real portion ZPR2 is associated with a capacitance value C1022, and so on until the real portion ZPRn is associated with a capacitance value C102n. The host controller 224 further associates an imaginary portion of the pre-determined impedance with a capacitance value of the capacitor 104 (FIGS. 1 & 2), or a capacitance value of the capacitor 162 (FIGS. 3 & 4), or an inductance value of the inductor 137 (FIG. 2), or an inductance value of the variable inductor 256 (FIG. 4), or an inductance value of a variable inductor (not shown) used in place of the inductor 106 (FIGS. 3, 4), or a capacitance value of a variable capacitance used in place of the capacitor 158 (FIGS. 3, 4), or a combination thereof. For example, the imaginary portion ZPI1 is associated with a capacitance value C1041 of the capacitor 104, or with an inductance value L1371 of the inductor 137, or with a capacitance value C1621 of the capacitor C162, or with an inductance value L2561 of the inductor L256, or with an inductance value of a variable inductor (not shown) used in place of the inductor 106, or with a capacitance value of a variable capacitance used in place of the capacitor 158, or a combination thereof. As another example, the imaginary portion ZPI2 is associated with a capacitance value C1042 of the capacitor 104, or with an inductance value L1372 of the inductor 137, or with a capacitance value C1622 of the capacitor C162, or with an inductance value L2562 of the inductor L256, or with an inductance value of a variable inductor (not shown) used in place of the inductor 106, or with a capacitance value of a variable capacitance used in place of the capacitor 158, or a combination thereof. As another example, the imaginary portion ZPIn is associated with a capacitance value C104n of the capacitor 104, or with an inductance value L137n of the inductor 137, or with a capacitance value C162n of the capacitor C162, or with an inductance value L256n of the inductor L256, or with an inductance value of a variable inductor (not shown) used in place of the inductor 106, or with a capacitance value of a variable capacitance used in place of the capacitor 158, or a combination thereof.

The host controller 224 identifies a capacitance value of the capacitor 102 based on the real portion ZPR. For example, the host controller 224 determines that there is a correspondence between the real portion ZPR1 and the capacitance value C1021 and identifies the capacitance value C1021 based on the real portion ZPR1. As another example, the host controller 224 determines that there is a correspondence between the real portion ZPR2 and the capacitance value C1022 and identifies the capacitance value C1022 and so on until the host controller 224 determines that there is a correspondence between the real portion ZPRn and the capacitance value C102n and identifies the capacitance value C102n.

Similarly, the host controller 224 determines a capacitance value of the capacitor 104, or an inductance value of the inductor 137, or a capacitance value of the capacitor 162, or an inductance value of the inductor 256, or an inductance value of a variable inductor (not shown) used in place of the inductor 106, or a capacitance value of a variable capacitance used in place of the capacitor 158, or a combination thereof based on the imaging portion ZPI. For example, the host controller 224 determines that there is a correspondence between the imaginary portion ZPI1 and the capacitance value C1041, or the inductance value L1371, or the capacitance value 1621, or the inductance value 2561, or an inductance value of a variable inductor (not shown) used in place of the inductor 106, or a capacitance value of a variable capacitance used in place of the capacitor 158, or a combination thereof, and identifies the capacitance value C1041, or the inductance value L1371, or the capacitance value 1621, or the inductance value 2561, or the inductance value of a variable inductor (not shown) used in place of the inductor 106, or the capacitance value of a variable capacitance used in place of the capacitor 158, or a combination thereof based on the imaginary portion ZPI1. As another example, the host controller 224 determines that there is a correspondence between the imaginary portion ZPIn and the capacitance value C104n, or the inductance value L137n, or the capacitance value 162n, or the inductance value 256n, or an inductance value of a variable inductor (not shown) used in place of the inductor 106, or a capacitance value of a variable capacitance used in place of the capacitor 158, or a combination thereof, and identifies the capacitance value C104n, or the inductance value L137n, or the capacitance value 162n, or the inductance value 256n, or the inductance value of a variable inductor (not shown) used in place of the inductor 106, or the capacitance value of a variable capacitance used in place of the capacitor 158, or a combination thereof based on the imaginary portion ZPIn.

It should be noted that in some embodiments, deposition rates or gamma values are used by the host controller 224 instead of etch rates. For example, a gamma value is calculated and/or identified by the host controller 224 based on a ratio of power reflected by plasma within the plasma chamber 122 towards the RF generator 132 and power supplied by an RF signal produced by the RF generator 132. The complex voltage and current at an output of a computer-generated model is used by the host controller 224 to calculate and/or identify the power supplied and the power reflected at the output. Based on the power supplied and the power reflected, a gamma value at the output of the computer-generated model is calculated and/or identified by the host controller 224. The calculated gamma value is compared by the host controller 224 with a pre-determined gamma value stored within a memory device of the host controller 224 to determine whether the calculated gamma value matches the pre-determined gamma value. As an example, the pre-determined gamma value is zero or within a range of zero. The pre-determined gamma value is a gamma value to be achieved at the point on the RF transmission line 168. Upon determining that the calculated gamma value does not match the pre-determined gamma value, an impedance is calculated and/or identified by the host controller 224 based on the pre-determined gamma value. A capacitance of the variable shunt capacitor 102 is changed to achieve a real portion of the impedance. Moreover, in addition or instead of changing the capacitance of the variable shunt capacitor 102, a capacitance of the variable capacitor 104, and/or an inductance of the variable inductor 104, and/or a capacitance of the variable capacitor 162, and/or an inductance of the variable inductor 256, and/or an inductance value of a variable inductor (not shown) used in place of the inductor 106, and/or a capacitance value of a variable capacitance used in place of the capacitor 158, is changed to achieve an imaginary portion of the impedance.

Figure 6:
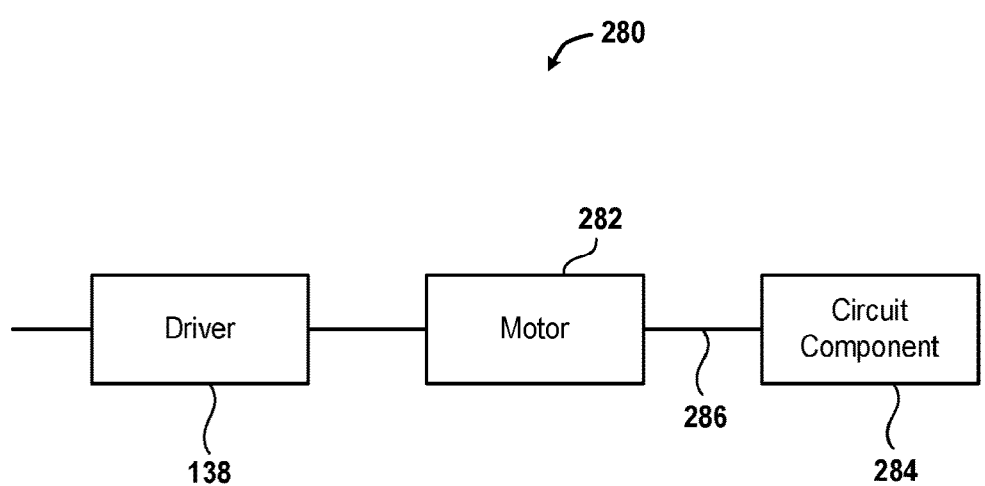
FIG. 6 is a block diagram of a control system for controlling an electrical circuit element, in accordance with an embodiment described in the present disclosure.

FIG. 6 is a block diagram of an embodiment of a control system 280 for controlling an electrical circuit component 284. The control system 280 includes a driver 138, a motor 282, and the circuit component 284. Examples of the circuit component 284 include an inductor and a capacitor. An example of a capacitor includes a variable capacitor. Examples of a variable capacitor includes a vacuum variable capacitor (VVC) and an air variable capacitor. In some embodiments, the motor 282 is integrated within the circuit component 284. Examples of the driver 138 includes a circuit that produces a current. Examples of a circuit that produces a current when a threshold voltage is applied includes a circuit that includes a number of transistors.

When the host controller 224 sends a signal to the driver 138 to control the circuit component 284, the driver 138 generates a current that rotates a rotor of the motor 282 with respect to a stator of the motor 282. The rotation results in a rotation of a link 286, e.g., a rod, a threaded rod, a screw shaft, sleeve and plunger, etc., between the motor 282 and the circuit component 284. The rotation of the link 286 results in a change in distance between plates of a capacitor or in extension or contraction of an inductor. The change in the distance between the plates of the capacitor changes a capacitance of the capacitor. Moreover, the extension or contraction of the inductor changes an inductance of the inductor.

In various embodiments, the driver 138 is coupled to the circuit component 284 without being coupled to the motor 282. For example, a reverse-biased semiconductor diode has a depletion layer thickness, which changes with a direct current (DC) voltage applied across the diode.

Figure 7:
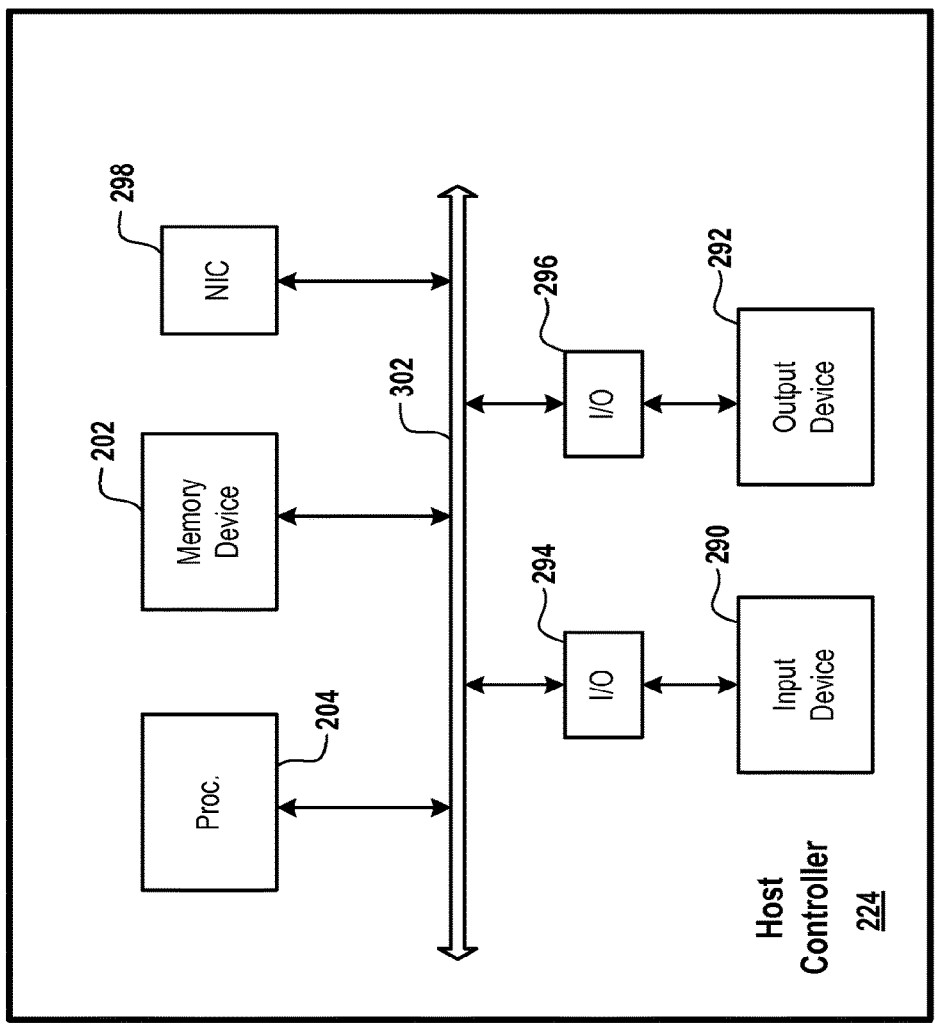
FIG. 7 is a diagram of a host controller of the systems of FIGS. 1 thru 4, in accordance with an embodiment described in the present disclosure.

FIG. 7 is a diagram of an embodiment of the host controller 224. The host controller 224 includes the processor 204, a memory device 202, an input device 290, an output device 292, an input/output (I/O) interface 294, an I/O interface 296, a network interface controller (NIC) 298, and a bus 302. The processor 204, the memory device 202, the input device 290, the output device 292, the I/O interface 294, the I/O interface 296, and the NIC 298 are coupled with each other via the bus 302. Examples of the input device 290 include a mouse, a keyboard, a stylus, etc. Examples of the output device 292 include a display, a speaker, or a combination thereof. The display may be a liquid crystal display, a light emitting diode display, a cathode ray tube, a plasma display, etc. Examples of the NIC 274 include a network interface card, a network adapter, etc.

Examples of an I/O interface include an interface that provides compatibility between pieces of hardware coupled to the interface. For example, the I/O interface 294 converts a signal received from the input device 290 into a form, amplitude, and/or speed compatible with the bus 302. As another example, the I/O interface 296 converts a signal received from the bus 302 into a form, amplitude, and/or speed compatible with the output device 292.

Figure 8:
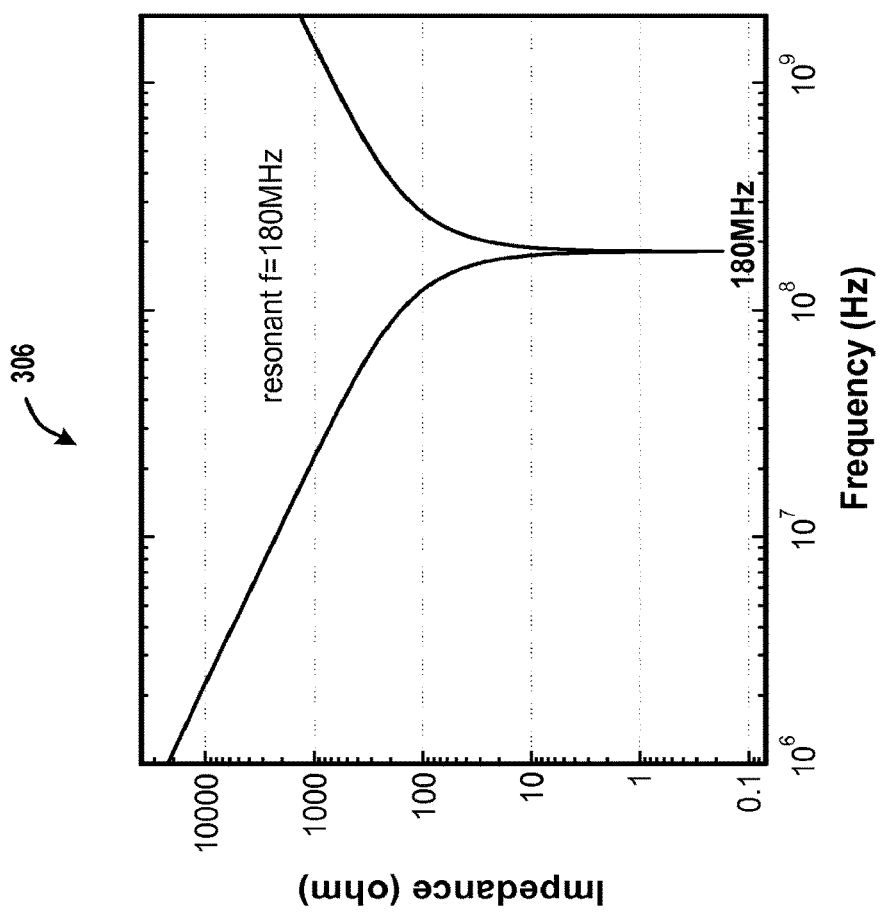
FIG. 8 is a graph that plots an impedance at a node of a computer-generated model versus a harmonic frequency of an RF supply signal at a point on an RF transmission line corresponding to the node, in accordance with an embodiment described in the present disclosure.

FIG. 8 is an embodiment of a graph 306 that plots an impedance at a node of a computer-generated model versus a frequency of an RF signal at a point on the RF transmission line 168 (FIG. 1) corresponding to the node. As shown in graph 306, the impedance changes with a frequency of the RF generator 132 (FIG. 1) that supplies the RF signal and vice versa. The impedance reaches a minimum at a frequency close to a harmonic frequency of the RF signal.

Figure 9:
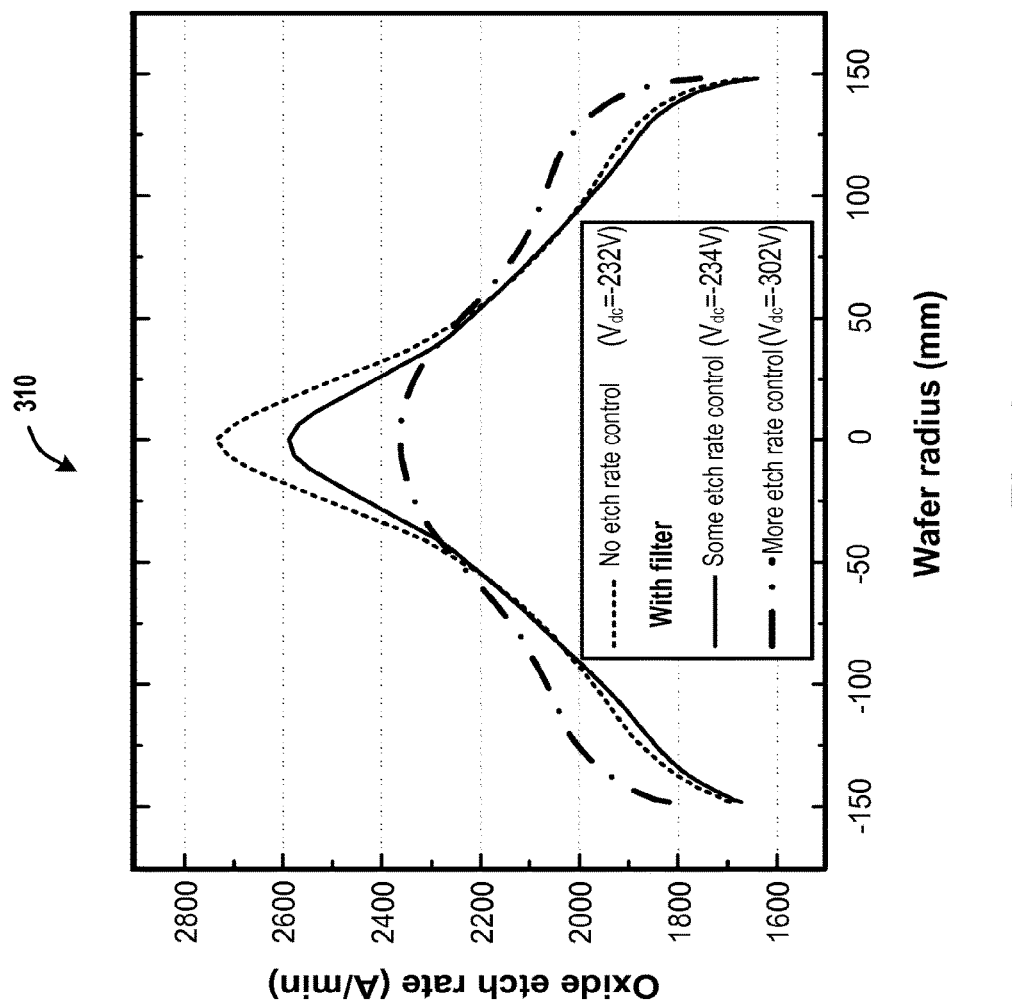
FIG. 9 is a graph that plots an etch rate of etching a substrate with respect to a radius of the substrate for different levels of etch rate control, in accordance with an embodiment described in the present disclosure.

FIG. 9 is an embodiment of a graph 310 that plots an etch rate of etching a substrate with respect to a radius of the substrate for different levels of etch rate control. A computer-generated model is used to determine an etch rate and the etch rate is compared to a pre-determined etch rate to increase uniformity in etch rates. Also, it is shown in graph 310 that when a computer-generated model is not used, there is a non-uniformity in etch rates.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber of an inductively coupled plasma (ICP) reactor, or of a transformer coupled plasma (TCP) reactor, conductor tools, or of an electron-cyclotron resonance (ECR) reactor, etc. For example, the RF generator 132 (FIG. 1) is coupled to an inductor within a plasma chamber of the ICP reactor.

It is also noted that although the operations above are described as being performed by the host controller 224 (FIG. 1), in some embodiments, the operations may be performed by one or more processors of the host controller 224, or by multiple processors of multiple host systems, or by multiple processors of RF generators.

It should be noted that although the above-described embodiments relate to providing an RF signal to the lower electrode of a chuck of a plasma chamber, and grounding an upper electrode of the plasma chamber, in several embodiments, the RF signal is provided to the upper electrode while the lower electrode is grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a non-transitory computer-readable medium. In some embodiments, the non-transitory computer-readable medium is a memory device that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the method operations above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method comprising:
    receiving a complex variable measured at an output of a radio frequency (RF) generator, wherein the RF generator is coupled to an impedance matching circuit via an RF cable, wherein the RF cable is coupled between the output of the RF generator and the impedance matching circuit, wherein the impedance matching circuit is coupled to a plasma chamber via an RF transmission line;
    propagating the measured complex variable through a computer-generated model to generate a calculated complex variable at an output of the computer-generated model, wherein said propagating the measured complex variable includes calculating a directional sum of the measured complex variable and a plurality of values of a plurality of electrical circuit elements of the computer-generated model;
    determining whether the calculated complex variable matches a desirable complex variable;
    controlling a variable circuit component of the impedance matching circuit until the calculated complex variable matches the desirable complex variable,
    wherein controlling the variable circuit component includes controlling a shunt capacitor of the impedance matching circuit until a match between a real portion of the calculated complex variable and a real portion of the desirable complex variable is achieved; and
    controlling a series component of the impedance matching circuit until a match between an imaginary portion of the calculated complex variable and an imaginary portion of the desirable complex variable is achieved.

2. The method of claim 1, wherein the measured complex variable is an impedance.

3. The method of claim 1, wherein the measured complex variable is a measured complex impedance and the desirable complex variable is a desirable complex impedance.

4. The method of claim 1, wherein the computer-generated model has a combined impedance of the RF cable and the impedance matching circuit.

5. The method of claim 1, wherein the computer-generated model has a combined impedance of the RF cable, the impedance matching circuit, and at least a portion of the RF transmission line.

6. The method of claim 1, wherein the measured complex variable is a complex voltage and current.

7. The method of claim 1, wherein the computer-generated model is generated based on a plurality of circuit components of the impedance matching circuit and a plurality of connections between the plurality of circuit components of the impedance matching circuit.

8. A host controller comprising:
a memory device for storing a measured complex variable; and
a host processor coupled to the memory device, the host processor configured to:
receive the measured complex variable, wherein the measured complex variable is measured at an output of a radio frequency (RF) generator, wherein the RF generator is coupled to an impedance matching circuit via an RF cable, wherein the RF cable is coupled between the output of the RF generator and the impedance matching circuit, wherein the impedance matching circuit is coupled to a plasma chamber via an RF transmission line;
propagate the measured complex variable through a computer-generated model to generate a calculated complex variable at an output of the computer-generated model, wherein to propagate the measured complex variable through the computer-generated model, the host processor is configured to calculate a directional sum of the measured complex variable and a plurality of values of a plurality of electrical circuit elements of the computer-generated model;
determine whether the calculated complex variable matches a desirable complex variable;
control a variable circuit component of the impedance matching circuit until the calculated complex variable matches the desirable complex variable, wherein to control the variable circuit component, the host processor is configured to control a shunt capacitor of the impedance matching circuit until a match between a real portion of the calculated complex variable and a real portion of the desirable complex variable is achieved; and
control a series component of the impedance matching circuit until a match between an imaginary portion of the calculated complex variable and an imaginary portion of the desirable complex variable is achieved.

9. The host controller of claim 8, wherein the measured complex variable is a complex impedance.

10. The host controller of claim 8, wherein the measured complex variable is a measured complex impedance and the desirable complex variable is a desirable complex impedance.

11. The host controller of claim 8, wherein the computer-generated model has a combined impedance of the RF cable and the impedance matching circuit.

12. The host controller of claim 8, wherein the computer-generated model has a combined impedance of the RF cable, the impedance matching circuit, and at least a portion of the RF transmission line.

13. The host controller of claim 8, wherein the measured complex variable is a complex voltage and current.

14. A plasma system comprising:
a radio frequency (RF) generator configured to generate an RF signal;
an impedance matching circuit coupled to the RF generator via an RF cable to receive the RF signal via the RF cable, wherein the RF cable is coupled between an output of the RF generator and the impedance matching circuit, wherein the impedance matching circuit is configured to modify the RF signal to generate a modified RF signal;
a plasma chamber coupled to the impedance matching circuit via an RF transmission line, wherein the RF transmission line is configured to transfer the modified RF signal to the plasma chamber; and
a host controller coupled to the RF generator, wherein the host controller includes:
a memory device for storing a measured complex variable;
a host processor coupled to the memory device, the host processor configured to:
receive the measured complex variable, wherein the measured complex variable is measured at the output of the RF generator;
propagate the measured complex variable through a computer-generated model to generate a calculated complex variable at an output of the computer-generated model, wherein to propagate the measured complex variable through the computer-generated model, the host processor is configured to calculate a directional sum of the measured complex variable and a plurality of values of a plurality of electrical circuit elements of the computer-generated model;
determine whether the calculated complex variable matches a desirable complex variable;
control a variable circuit component of the impedance matching circuit until the calculated complex variable matches the desirable complex variable, wherein to control the variable circuit component, the host processor is configured to control a shunt capacitor of the impedance matching circuit until a match between a real portion of the calculated complex variable and a real portion of the desirable complex variable is achieved; and
control a series component of the impedance matching circuit until a match between an imaginary portion of the calculated complex impedance and an imaginary portion of the desirable complex impedance is achieved.

15. The plasma system of claim 14, wherein the measured complex variable is a complex impedance.

16. The plasma system of claim 15, wherein the measured complex variable is a measured complex impedance and the desirable complex variable is a desirable complex impedance.

17. The plasma system of claim 14, wherein the computer-generated model has a combined impedance of the RF cable and the impedance matching circuit.

18. The plasma system of claim 14, wherein the computer-generated model has a combined impedance of the RF cable, the impedance matching circuit, and at least a portion of the RF transmission line, wherein the measured complex variable is a complex voltage and current or an impedance.

* * * * *